US009074794B2

United States Patent
Suryanarayana et al.

(10) Patent No.: US 9,074,794 B2
(45) Date of Patent: Jul. 7, 2015

(54) SYSTEMS AND METHODS FOR CO-PRODUCTION OF GEOTHERMAL ENERGY AND FLUIDS

(75) Inventors: Poodi Peddi Suryanarayana, Plano, TX (US); Parveen Sachdeva, Frisco, TX (US); Ismail Ceyhan, Houston, TX (US); Gary Allen Ring, Collinsville, TX (US)

(73) Assignee: BLADE ENERGY PARTNERS LTD., Frisco, TX (US)

( * ) Notice: Subject to any disclaimer, the term of this patent is extended or adjusted under 35 U.S.C. 154(b) by 400 days.

(21) Appl. No.: 13/491,680

(22) Filed: Jun. 8, 2012

(65) Prior Publication Data

US 2012/0312545 A1    Dec. 13, 2012

Related U.S. Application Data

(60) Provisional application No. 61/496,007, filed on Jun. 12, 2011.

(51) Int. Cl.
*F24J 3/08*    (2006.01)

(52) U.S. Cl.
CPC *F24J 3/081* (2013.01); *F24J 3/086* (2013.01); *Y02E 10/12* (2013.01); *Y02E 10/16* (2013.01)

(58) Field of Classification Search
USPC ................... 166/369, 57, 114, 266, 302, 303; 60/641.1–641.4
See application file for complete search history.

(56) References Cited

U.S. PATENT DOCUMENTS

| | | | |
|---|---|---|---|
| 3,662,832 A | 5/1972 | Keeler et al. | |
| 2009/0126923 A1 | 5/2009 | Montgomery et al. | |
| 2010/0200237 A1 | 8/2010 | Colgate et al. | |
| 2011/0079380 A1* | 4/2011 | Tyler et al. ...................... | 166/57 |

FOREIGN PATENT DOCUMENTS

WO    2011014521 A1    2/2011

OTHER PUBLICATIONS

Tester, et. al., "The Future of Geothermal Energy", Massachusetts Institute of Technology, (2006), Chapters 1, 2 and 7 only.
Petty et al., "Updated U.S. Geothermal Supply Characterization", presented a the 32nd Workshop on Geothermal Reservoir Engineering, Stanford, California, Jan. 22-24, 2007.
(Continued)

*Primary Examiner* — David Bagnell
*Assistant Examiner* — Taras P Bemko
(74) *Attorney, Agent, or Firm* — Jeffrey L. Wendt; The Wendt Firm, P.C.

(57) ABSTRACT

Systems include a well having a production casing and a production tubing positioned therein, forming an annulus there between. A packer is positioned in the annulus at a position sufficient to separate the annulus into a first portion and a second portion. The well further includes a tie-back conduit positioned in the first portion of the annulus and configured to allow heat transfer between a working fluid flowing through the first portion of the annulus and a production fluid flowing through the production tubing, thus separating the circulating working fluid from fluids in the second portion of the annulus. A working fluid loop is fluidly connected to the first portion of the annulus. Co-production methods, methods of modeling, and computer-readable media including the methods of modeling are disclosed.

19 Claims, 12 Drawing Sheets

(56) References Cited

OTHER PUBLICATIONS

Augustine et al., "National Co-Produced Fluids Resource Estimate", National Renewable Energy Laboratory (NREL) (2010).
Erkan, et al., "Understanding the Chena Hot Springs, Alaska, geothermal system using temperature and pressure data", Geothermics 37 (6): 565-585 (2008).
Sanyal, et al., "Geothermal Power Capacity from Petroleum Wells—Some Case Histories Of Assessment", Proceedings World Geothermal Congress 2010, Bali, Indonesia, Apr. 2010.
Ramey, H. J., 1962, "Wellbore Heat Transmission," Journal of Petroleum Technology, Apr. 1962, pp. 427-435.
Hodge, B. K., 1990, Analysis and Design of Energy Systems, Second Edition, Prentice Hall, New Jersey.
Lemmon, et. al., "NIST Standard Reference Database 23: Reference Fluid Thermodynamic and Transport Properties-REFPROP, Version 9.0", NIST, Gaithersburg, MD, USA (2010).
Johnson et al., "Produced Water from NPR-3 Oil and Gas Wells for Low Temperature Geothermal Application", Paper provided to authors.
Johnson, L.A., "Testing of ORMAT Technology's Low-Temperature Geothermal Application", presented at the Geothermal in the Oil Field Symposium, Casper, Wyoming, Aug. 2010.
Shilling et al., "Development of Fatigue Resistant Heavy Wall Riser Connectors for Deepwater HPHT Dry Tree Riser Systems", OMAE2009-79518.
AAPG, 1972, "Oil/Gas Well Database, Location of Texas Geothermal Resources", American Association of Petroleum Geologists.
Willhite, G. (1967) "Over-all Heat Transfer Coefficients in Steam and Hot Water Injection Wells" Paper SPE 1449-PA, J Petroleum Tech, 1967;19(5):607-15.
US DOE, Geothermal Maps, http://www1.eere.energy.gov/geothermal/maps.html.
PCT International Search Report for International Application No. PCT/US2012/041844, Aug. 21, 2012 (pp. 1-6).
PCT Written Opinion for International Application No. PCT/US2012/041844, Aug. 21, 2012 (pp. 1-8).

\* cited by examiner

- ──◯── Isobutane 330 gpm
- ──■── Isobutane 220 gpm
- ──▲── Isobutane 110 gpm
- ──◯──  R245fa 330 gpm
- ──■──  R245fa 220 gpm
- ──▲──  R245fa 110 gpm Reservoir Depth = 10,000 ft
Reservoir Temperature = 260 °F
Reservoir Pressure = 4,500 psi
Produced Fluid Rate = 10,000 BPD

Fig. 11

Identifying flow streams, depending upon flow and thermal conditions, the flow streams comprising at least:

a production fluid stream divided into first and second production fluid streams as per the thermal conditions, the first production fluid stream flowing through a production tubing of a downhole heat exchanger section of a wellbore, a working fluid return stream which thermally interacts with the first production fluid stream through the production tubing, the second production fluid stream thermally interacting solely with the wellbore and formation below the downhole heat exchanger section, optionally through a lower casing, and a working fluid delivery stream flowing into and through the downhole heat exchanger section, wherein the downhole heat exchanger section comprises an annulus between the production tubing and an upper casing, the annulus divided by an isolation packer positioned in the annulus at a position sufficient to separate the annulus into a first portion and a second portion, and a tie-back conduit positioned in the first portion of the annulus and configured to allow heat transfer between the working fluid return stream flowing through the first portion of the annulus and the first production fluid stream traversing through the production tubing, thus separating circulating working fluid from fluids in the second portion of the annulus.

SYSTEMS AND METHODS FOR CO-PRODUCTION OF GEOTHERMAL ENERGY AND FLUIDS

CROSS-REFERENCE TO RELATED APPLICATIONS

This application claims domestic priority benefit under 35 U.S.C. §119(e) from applicants' provisional patent application Ser. No. 61/496,007, filed Jun. 12, 2011, which is incorporated herein by reference.

BACKGROUND INFORMATION

1. Technical Field

The present disclosure relates in general to systems and methods useful in the production of energy. In particular, the present disclosure relates to systems and methods for production of energy from geothermal sources, as well as computer readable media for evaluating and/or comparing and/or simulating such systems and methods. The systems, methods, and computer readable media disclosed herein are useful in, for example, but not limited to, hydrocarbon exploration wells, production wells, well drilling, well completions, and well intervention.

2. Background Art

The thermal energy in co-produced oil and gas wells has been mentioned as a substantial resource for geothermal energy. In an assessment of geothermal energy by Tester, et. al., "*The Future of Geothermal Energy*", Massachusetts Institute of Technology, (2006), the geothermal energy potential from co-production in seven United States Gulf Coast states is suggested to be as much as 5,300 megaWatts (MW). Another recent analysis by Petty et al., "*Updated U.S. Geothermal Supply Characterization*", presented a the $32^{nd}$ Workshop on Geothermal Reservoir Engineering, Stanford, Calif., Jan. 22-24, 2007 estimated a competitive coproduction resource for the United States at about 40 GW of power generation potential.

Candidate wells for co-produced energy may be oil and gas producers with high water cut, and the geothermal potential may be dependent upon two key parameters—rate of fluid production and resource temperature (for a given surface system and ambient temperature). In typical hydrocarbon wells, resource temperature requirements may impose minimum depth and geothermal gradient constraints. For instance, the geological thermal gradient along Texas Gulf Coast region (American Association of Petroleum Geologists, 1972) indicates that to reach geothermal temperatures of 250° F. (121° C.), the well has to reach depths of at least 12,000 ft. (3660 meters). Several maps of the US geothermal resource potential (based on temperature) have been developed (see, for example, Tester, et. al. 2006; USDOE). Recently, Augustine et al., "*National Co-Produced Fluids Resource Estimate*", National Renewable Energy Laboratory (NREL) (2010) have presented a database of existing oil and gas wells and a method to assess their potential for thermal energy recovery. They propose this as an approach for screening co-production prospects in the United States.

Whether geo-pressured or depleted high water-cut wells, the most commonly suggested surface system for co-produced geothermal power generation is a binary cycle. Binary cycle power plants operate at inlet fluid temperatures of about 225°-360° F. (107°-182° C.) (Erkan, et al., "*Understanding the Chena Hot Springs, Alaska, geothermal system using temperature and pressure data*", Geothermics 37 (6): 565-585 (2008)). In the typical binary power plant, hot water from a geothermal resource is brought to surface and is used to boil a working fluid, usually an organic compound with a low boiling point, such as isobutane, R245Fa, Ammonia, and the like. The working fluid is vaporized in a heat exchanger using the hot water, and drives a turbine to generate power. The working fluid is then cooled (condensed) and cycled back.

Sanyal, et al., "*Geothermal Power Capacity from Petroleum Wells—Some Case Histories Of Assessment*", Proceedings World Geothermal Congress 2010, Bali, Indonesia, April (2010), conducted a study to assess power generation potential for co-produced petroleum wells. They present a correlation between the net power generated (per unit water flow rate) and the water temperature. The correlation is based on data from fifteen operating binary power plants, representing four different binary technologies.

Reservoir deliverability is the primary factor that drives the economic viability of any hydrocarbon or geothermal well production system. Oil and gas wells are designed to exclude as much water as possible. However, for fluid reservoirs with sufficient thermal energy potential, there will be a thermal energy price point at which thermal energy will (and should) influence the well design. Currently the majority of thermal energy from oil and gas production is wasted to the atmosphere. Unlike classical hydrothermal or even enhanced geothermal resources, co-produced oil and gas wells present more complicated economic considerations, given that economic value derives from both the hydrocarbons and heat energy recovered using a binary cycle at the surface. A few of the factors to consider in assessing economic potential for such a co-produced system include:

Tolerance to decline in pressure and rate: all oil and gas wells are subject to decline in pressure and production rate. Co-production systems must tolerate this decline to be viable.

Heat loss in wellbore as production rates decline: oil and gas wells typically flow at much lower rates than is typical in hydrothermal geothermal wells. Thus, the produced fluids are subject to significant heat loss in the wellbore, which worsens with decline in production rates.

The composition and pressure of hydrocarbons being produced: as mentioned earlier, most oil and gas wells are designed with the intent of minimizing produced water rates, whereas geothermal energy, at least with binary cycles, will depend upon increased water rate. Indeed, even the ability handle hot, high pressure, hydrocarbon-rich, produced fluids is probably beyond the current state-of-the-art in binary technology.

Ability to handle corrosive and sour fluids: in many situations where thermal potential exists, the produced fluids contain $H_2S$, $CO_2$ and other components that need to be handled through suitable selection of metallurgy in the binary plant heat exchanger. This will add cost to the surface system.

The loss of thermal energy if pre-exchange separation is required: if the binary plant cannot handle corrosive and sour produced fluids, separation may be required prior to entry into the plant. This implies a (hopefully small) loss in thermal energy available in the plant.

Design of wells and completions to optimize overall energy recovery: ultimately, as co-production becomes more attractive, well design will have to evolve to consider overall energy recovery rather than either hydrocarbon or geothermal energy recovery. This is bound to influence the overall well design, and hence the cost of well construction and operation.

Introducing thermal energy recovery as an additional design criterion complicates the well design and production decisions. There is no simple set of formulas to determine the best solution when considering thermal energy recovery for a hydrocarbon recovery system. The thermal decline and hydrocarbon production decline curves from any well system will likely be different. The type of reservoir and hydrocarbon field development plan can also have a significant effect on the thermal energy recovery potential, since improved hydrocarbon recovery does not always imply improved thermal recovery. Evaluating the appropriate design and the associated economics for well systems that involve the co-production of hydrocarbons and thermal energy is thus a complex problem. Each resource, field development plan and production situation will need to be evaluated to decide whether a thermal recovery system is economically beneficial. In some cases maximizing the hydrocarbon production rate may not be the best way to optimize the overall energy recovery. Clearly, the story of co-production is an evolving one, with which the technical and economic evaluations will also evolve.

FIG. 1 illustrates a classical, prior art co-production system embodiment 100 based on a production well 20 at surface 18, wherein production well 20 comprises a casing 22, a production tubing 24, a production liner 25, a production packer 26, and packer fluid 32. Geothermal energy recovery in classical, prior art co-production system embodiment 100 is based on a binary surface heat exchange unit 6. A reservoir fluid, hydrocarbon/water mixture 21, is used as the hot fluid in a binary cycle at surface to generate geothermal energy. In one version, "a", stream 21 flows directly to heat exchange unit 6. If the composition of reservoir fluid 21 is not favorable, a separator 4 may be needed upstream of the working fluid loop 12 to separate hydrocarbons (stream A) from produced water (stream B), which can result in loss of some of the thermal energy (this is shown as configuration "b" in FIG. 1). The recoverable thermal energy may be used to generate electric power in a power generation unit 8, for example using a turbine 10, or to drive a pump (not illustrated) that allows for greater production rates (and hence more hydrocarbon generation). De-energized working fluid, stream 5, is routed to a cooling facility 14, such as a cooling tower, and waste heat may be vented to atmosphere. Cooled, de-energized working fluid 7 is routed to heat exchange unit 6 to be re-heated by produced fluid. An energized working fluid stream 9 is routed to power generation unit 8. Produced fluids are routed to a facility 16 for further processing after giving up heat to the working fluid in heat exchange unit 6.

Although binary systems are fairly common in hydrothermal and enhanced geothermal system (EGS) projects, there are a few disadvantages when used in co-produced projects. The main limitations when a binary cycle is used in a co-produced well are:

production has to (usually) be dominated by water;
non-sour, non-corrosive composition is desired, given equipment limitations; and
production rate has to be very high to reduce wellbore heat loss and increase the net power generated.

While use of co-production systems and methods of installation have increased, there remains a need for improved co-production systems and methods.

SUMMARY

In accordance with the present disclosure, co-production systems and methods of using same are described which reduce or overcome many of the faults of previously known systems and methods.

A first aspect of the disclosure is a system comprising:
a well comprising a production casing and a production tubing positioned therein, forming an annulus there between;
an isolation packer positioned in the annulus at a position sufficient to separate the annulus into a first portion and a second portion;
the well further comprising a tie-back conduit positioned in the first portion of the annulus and configured to allow heat transfer between a working fluid flowing through the first portion of the annulus and a production fluid traversing through the production tubing, thus separating the circulating working fluid from fluids in the second portion of the annulus; and
a working fluid loop fluidly connected to the first portion of the annulus.

A second aspect of the disclosure is an annular circulation co-production system comprising:
a well comprising a production casing and a production tubing positioned therein, forming an annulus there between;
an isolation packer positioned in the annulus at a position sufficient to separate the annulus into a first portion and a second portion;
the well further comprising a tie-back conduit positioned in the first portion of the annulus and configured to allow heat transfer between a working fluid flowing through the first portion of the annulus and a production fluid traversing through the production tubing, thus separating the circulating working fluid from fluids in the second portion of the annulus, the tie-back conduit separating the first portion of the annulus into a working fluid delivery side and a working fluid return side; and
a working fluid loop fluidly connected to the first portion of the annulus, the working fluid loop comprising:
a working fluid return conduit fluidly connecting the working fluid return side to a power generation unit;
a working fluid delivery conduit fluidly connecting the working fluid delivery side to cooling facility; and
an expanded working fluid conduit fluidly connecting the power generation unit and the cooling facility.

A third aspect of this disclosure is a method comprising:
positioning a production casing and a production tubing into a well, forming an annulus there between;
positioning an isolation packer in the annulus at a position sufficient to separate the annulus into a first portion and a second portion;
positioning a tie-back conduit in the first portion of the annulus to allow heat transfer between a working fluid flowing through the first portion of the annulus and a production fluid traversing through the production tubing, thus separating the circulating working fluid from fluids in the second portion of the annulus;
flowing a working fluid into the first portion of the annulus;
flowing a production fluid through the production tubing; and
transferring heat between the production fluid and the working fluid in the first portion of the annulus.

A fourth aspect of this disclosure is a method of producing a fluid from a subterranean source, the method comprising the steps of:
positioning a production casing and a production tubing into a well, forming an annulus there between;
positioning an isolation packer in the annulus at a position sufficient to separate the annulus into a first portion and a second portion;

positioning a tie-back conduit in the first portion of the annulus to allow heat transfer between a working fluid flowing through the first portion of the annulus and a production fluid traversing through the production tubing, thus separating the circulating working fluid from fluids in the second portion of the annulus;

flowing a working fluid into the first portion of the annulus;

producing a production fluid through the production tubing; and transferring heat between the production fluid as it is produced from the source and the working fluid as the working fluid flows into and out of the first annulus portion.

A fifth aspect of this disclosure is a method of modeling an annular circulation co-production system, the method comprising:

identifying flow streams, depending upon flow and thermal conditions, the flow streams comprising at least:
a production fluid stream divided into first and second production fluid streams as per the thermal conditions, the first production fluid stream flowing through a production tubing of a downhole heat exchanger section of a wellbore,
a working fluid return stream which thermally interacts with the first production fluid stream through the production tubing,
the second production fluid stream thermally interacting solely with the wellbore and formation below the downhole heat exchanger section, optionally through a lower casing, and
a working fluid delivery stream flowing into and through the downhole heat exchanger section,
wherein the downhole heat exchanger section comprises an annulus between the production tubing and an upper casing, the annulus divided by an isolation packer positioned in the annulus at a position sufficient to separate the annulus into a first portion and a second portion, and a tie-back conduit positioned in the first portion of the annulus and configured to allow heat transfer between the working fluid return stream flowing through the first portion of the annulus and the first production fluid stream traversing through the production tubing, thus separating circulating working fluid from fluids in the second portion of the annulus;

modeling heat transfer between the second production fluid stream and the wellbore and formation below the downhole heat exchanger section, and optionally through a lower casing, using a first equation;

modeling heat transfer between the working fluid delivery stream and the formation through the upper casing using a second equation;

modeling heat transfer between the working fluid return stream and the first production fluid using a third equation;

modeling heat transfer between the working fluid return stream and the working fluid delivery stream using a fourth equation, the first, second, third, and fourth equations forming a coupled system of equations; and performing an energy balance for the system by solving the coupled system of equations numerically, providing heat transfer rates to determine the pressure, temperature and quality profile in the working fluid streams.

A sixth aspect of this disclosure is a computer-readable medium encoded with processing instructions for implementing a method of modeling an annular circulation co-production system, the method comprising:

identifying flow streams, depending upon flow and thermal conditions, the flow streams comprising at least:
a production fluid stream divided into first and second production fluid streams as per the thermal conditions, the first production fluid stream flowing through a production tubing of a downhole heat exchanger section of a wellbore,
a working fluid return stream which thermally interacts with the first production fluid stream through the production tubing,
the second production fluid stream thermally interacting solely with the wellbore and formation below the downhole heat exchanger section, optionally through a lower casing, and
a working fluid delivery stream flowing into and through the downhole heat exchanger section,
wherein the downhole heat exchanger section comprises an annulus between the production tubing and an upper casing, the annulus divided by an isolation packer positioned in the annulus at a position sufficient to separate the annulus into a first portion and a second portion, and a tie-back conduit positioned in the first portion of the annulus and configured to allow heat transfer between the working fluid return stream flowing through the first portion of the annulus and the first production fluid stream traversing through the production tubing, thus separating circulating working fluid from fluids in the second portion of the annulus;

modeling heat transfer between the second production fluid stream and the wellbore and formation below the downhole heat exchanger section, and optionally through a lower casing, using a first equation;

modeling heat transfer between the working fluid delivery stream and the formation through the upper casing using a second equation;

modeling heat transfer between the working fluid return stream and the first production fluid using a third equation;

modeling heat transfer between the working fluid return stream and the working fluid delivery stream using a fourth equation, the first, second, third, and fourth equations forming a coupled system of equations; and performing an energy balance for the system by solving the coupled system of equations numerically, providing heat transfer rates to determine the pressure, temperature and quality profile in the working fluid streams.

These and other features of the systems, methods and computer-readable media of the disclosure will become more apparent upon review of the brief description of the drawings, the detailed description, and the claims that follow.

BRIEF DESCRIPTION OF THE DRAWINGS

The manner in which the objectives of this disclosure and other desirable characteristics can be obtained is explained in the following description and attached drawings in which.

Figure 1:
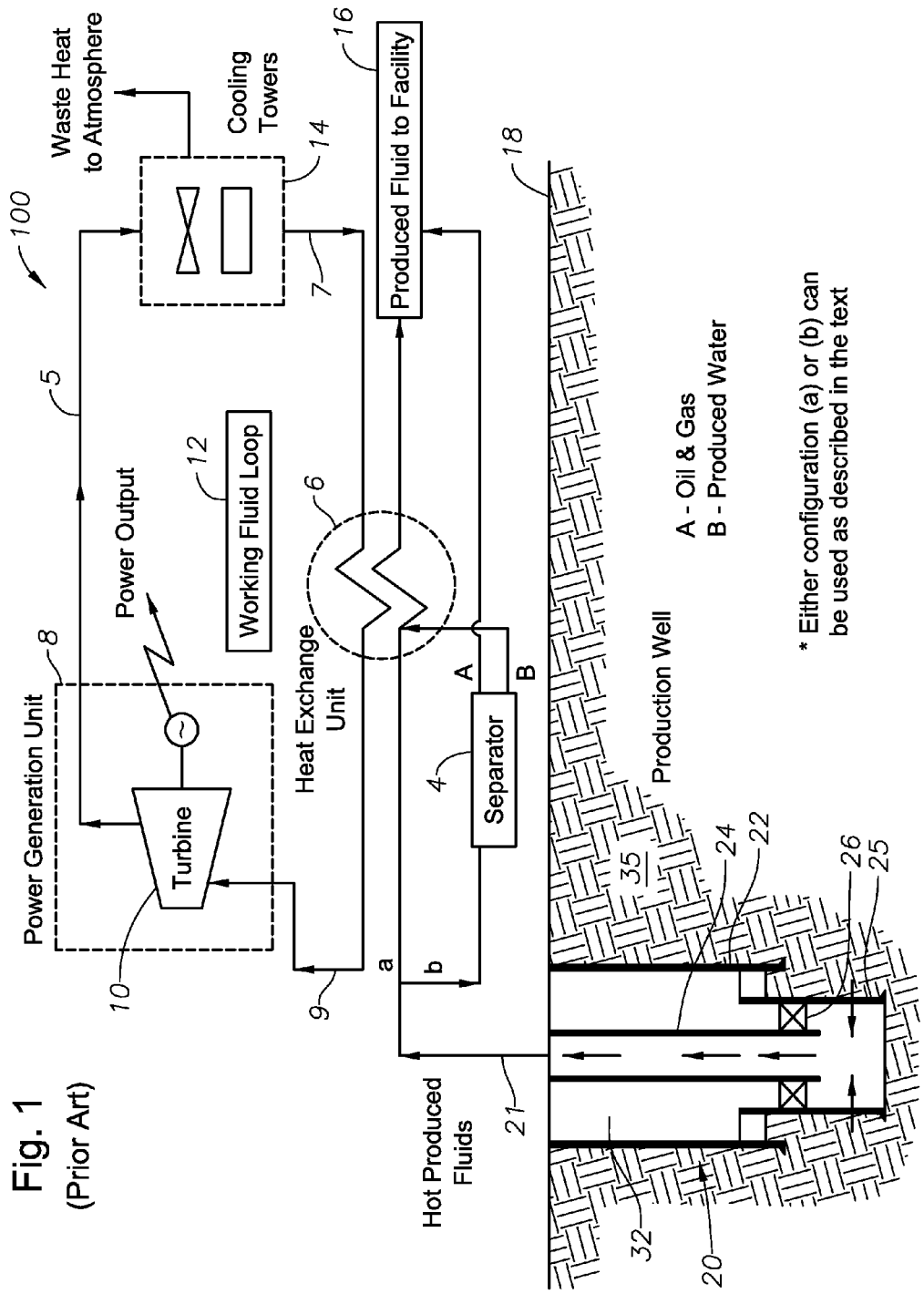
FIG. 1 schematically illustrates a classical, prior art co-production system embodiment.

It is to be noted, however, that the appended drawings are not to scale and illustrate only typical embodiments of this disclosure, and are therefore not to be considered limiting of its scope, for the disclosure may admit to other equally effective embodiments. Identical reference numerals are used throughout the several views for like or similar elements.

DETAILED DESCRIPTION

In the following description, numerous details are set forth to provide an understanding of the disclosed methods, systems, and apparatus. However, it will be understood by those skilled in the art that the methods, systems, and apparatus may be practiced without these details and that numerous variations or modifications from the described embodiments may be possible. All U.S. published patent applications and U.S. patents referenced herein are hereby explicitly incorporated herein by reference. In the event definitions of terms in the referenced patents and applications conflict with how those terms are defined in the present application, the definitions for those terms that are provided in the present application shall be deemed controlling.

Proposed herein are alternative well design systems and methods for co-produced wells to address some of the concerns with the conventional, binary-cycle based systems and methods. As discussed herein below, a principle variation in design is an isolated annular-circulation loop through which the working fluid is circulated. In certain embodiments the working fluid extracts heat from the production stream in its return path, in what is essentially a parallel-flow downhole heat exchanger. The "A" annulus (the annulus between the production tubing and production casing) of the producing well is converted into a circulating loop for the working fluid by running a tie-back between the production casing and the production tubing. An isolation packer separates the circulating working fluid loop from the rest of the A annulus. With appropriate selection of the working fluid type and rate, and depth of circulation (constrained by the top of liner and reservoir depth), the downhole heat exchange is sufficient to vaporize the working fluid, which is then used to drive a turbine just as in the binary system. In essence, the surface heat exchanger of the binary system is replaced with the wellbore itself.

The proposed design alternative has several apparent benefits. Firstly, the produced fluid (and the production system) is isolated from the geothermal energy recovery cycle, which allows thermal energy recovery from any produced fluid, as long as the produced fluid carries sufficient thermal energy. The geothermal system no longer needs to be able to handle high pressure, sour, corrosive fluids. Second, co-produced wells are typically deeper than 12,000 ft. (3660 meters), providing a long downhole heat exchanger for the working fluid, which can be used as required to maximize thermal energy recovery. Thirdly, the working fluid rate can be modified to maximize energy recovery even as the production rate varies and declines. This allows for much greater tolerance to variations in produced fluid rates and composition (than a typical binary system). However, these benefits must be considered alongside some disadvantages, chief among which are the need for a well workover to create the annular circulation loop (if the system is implemented in an existing hydrocarbon well), and the possible need for distributed single-well surface energy system (as opposed to a binary plant into which the flow from several wells can be combined). Several well design, equipment and economic considerations also arise, which are discussed in detail in the Examples, as well as the viability of ACC systems and methods in terms of thermal energy recovery. In addition to thermal energy recovery, the economics and well design considerations are also discussed in the Examples.

Described herein are systems comprising:
  a well comprising a production casing and a production tubing positioned therein, forming an annulus there between;
  an isolation packer positioned in the annulus at a position sufficient to separate the annulus into a first portion and a second portion;
  the well further comprising a tie-back conduit positioned in the first portion of the annulus and configured to allow heat transfer between a working fluid flowing through the first portion of the annulus and a production fluid traversing through the production tubing, thus separating the circulating working fluid from fluids in the second portion of the annulus; and
  a working fluid loop fluidly connected to the first portion of the annulus.

In certain systems the tie-back conduit may be positioned to allow heat transfer between the working fluid circulating through the first portion of the annulus and the production fluid traversing through the production tubing as the production fluid flows out of the well.

In certain systems the tie-back conduit and production tubing may be configured into a substantially parallel-flow heat exchanger.

In certain systems the tie-back conduit may separate the first portion of the annulus into a working fluid delivery side and a working fluid return side.

In certain systems the working fluid loop may comprise:
  a working fluid return conduit fluidly connecting the working fluid return side to an expansion turbine;
  a working fluid delivery conduit fluidly connecting the working fluid delivery side to cooling facility; and
  an expanded working fluid conduit fluidly connecting the expansion turbine and the cooling facility.

Certain systems may further comprise a pump allowing variation of rate of flow of the working fluid in the delivery conduit.

In certain systems the well may have a depth of at least 10,000 feet, and the isolation packer and tie-back conduit are positioned and configured so that the tie-back conduit has a length ranging from 5000 feet to just under 10,000 feet.

Certain methods may comprise flowing the working fluid and production fluid in a substantially parallel flow arrangement.

Certain methods may comprise flowing a working fluid return stream from the first portion of the annulus to a power generation unit, and extracting power from the working fluid return stream using the power generation unit, forming a depleted working fluid.

Certain methods may comprise flowing the depleted working fluid to a cooling facility, forming a working fluid delivery stream.

Certain methods may comprise flowing the production fluid out of the well and to a facility for processing.

In certain methods the power generation unit may comprise an expansion turbine.

In certain methods the cooling facility may be a cooling tower.

Certain methods may comprise pumping the working fluid delivery stream to the first portion of the annulus to generate enough hydraulic energy to force the working fluid to the power generation unit.

Certain methods of modeling an annular circulation co-production system may comprise modeling frictional pressure losses for one or more of the streams.

Certain methods of modeling may comprise factoring in a gravitational gradient based on in-situ density of one or more of the streams calculated using a PVT model.

Certain methods of modeling may comprise modeling a surface system to calculate the net power generated from the working fluid return stream in a power generation unit.

Certain methods of modeling may comprise:

modeling heat transfer between the working fluid stream and the produced fluid stream in a binary system using a fifth equation;

performing an energy balance for the binary system by solving the fifth equation, providing heat transfer rates to determine the pressure, temperature and quality profile in the working fluid streams for the binary system; and comparing the pressure, temperature and quality profile in the working fluid streams for the binary system with the pressure, temperature and quality profile in the working fluid streams for the co-production system.

Certain methods of modeling may comprise using a computer server and software in or accessible to the computer server, the computer server using the software to implement the method to aid in thermal-hydraulic analysis of different prospects and well designs.

In certain methods of modeling the software may model wellbore geometries having up to three flow streams.

In certain methods of modeling the software may models at least five different working fluids.

In certain methods of modeling the software may model systems producing fluids selected from the group consisting of water, hydrocarbons, and mixtures thereof. In certain methods hydrocarbons may be selected from the group consisting of liquids, gases, and mixtures thereof.

In certain methods of modeling, both binary and annular circulation co-production systems may be modeled.

In certain methods of modeling, systems comprising flow path configurations other than binary and annular circulation co-production may be modeled.

In certain methods of modeling the systems comprising flow path configurations other than binary and annular circulation co-production may have a maximum of three flow streams interacting.

Certain computer-readable media encoded with processing instructions for implementing a method of modeling an annular circulation co-production system may comprise software for modeling frictional pressure losses for one or more of the streams.

Certain computer-readable media may comprise software factoring in a gravitational gradient based on in-situ density of one or more of the streams calculated using a PVT model.

Certain computer-readable media may comprise software modeling a surface system to calculate the net power generated from the working fluid return stream in a power generation unit.

Certain computer-readable media may comprise:

modeling heat transfer between the working fluid stream and the produced fluid stream in a binary system using a fifth equation;

performing an energy balance for the binary system by solving the fifth equation, providing heat transfer rates to determine the pressure, temperature and quality profile in the working fluid streams for the binary system; and comparing the pressure, temperature and quality profile in the working fluid streams for the binary system with the pressure, temperature and quality profile in the working fluid streams for the co-production system.

Certain computer-readable media may comprise a computer server and software in or accessible to the computer server, the computer server using the software to implement the method to aid in thermal-hydraulic analysis of different prospects and well designs.

In certain computer-readable media the software may model wellbore geometries having up to three flow streams.

In certain computer-readable media the software may model at least five different working fluids.

In certain computer-readable media the software may model systems producing fluids selected from the group consisting of water, hydrocarbons, and mixtures thereof.

In certain computer-readable media the hydrocarbons may be selected from the group consisting of liquids, gases, and mixtures thereof.

In certain computer-readable media both binary and annular circulation co-production systems may be modeled.

In certain computer-readable media systems comprising flow path configurations other than binary and annular circulation co-production may be modeled.

In certain other computer-readable media the systems comprising flow path configurations other than binary and annular circulation co-production may have a maximum of three flow streams interacting.

As used herein the phrase "subterranean source" includes, but is not limited to production sources such as land-based and subsea wells, land-based and subsea BOPs, subsea risers, subsea and land-based manifolds, land-based and subsea piping and pipelines, land-based and subsea storage facilities, and the like, whether producing, transporting and/or storing gas, liquids, or combination thereof, including both organic and inorganic materials.

The systems and methods described herein may provide other benefits, and the methods are not limited to particular end uses; other obvious variations of the systems and methods may be employed.

The primary features of the systems, methods, and apparatus of the present disclosure will now be described with reference to the drawing figures, after which some of the construction and operational details will be further explained. The same reference numerals are used throughout to denote the same items in the figures.

Figure 2:
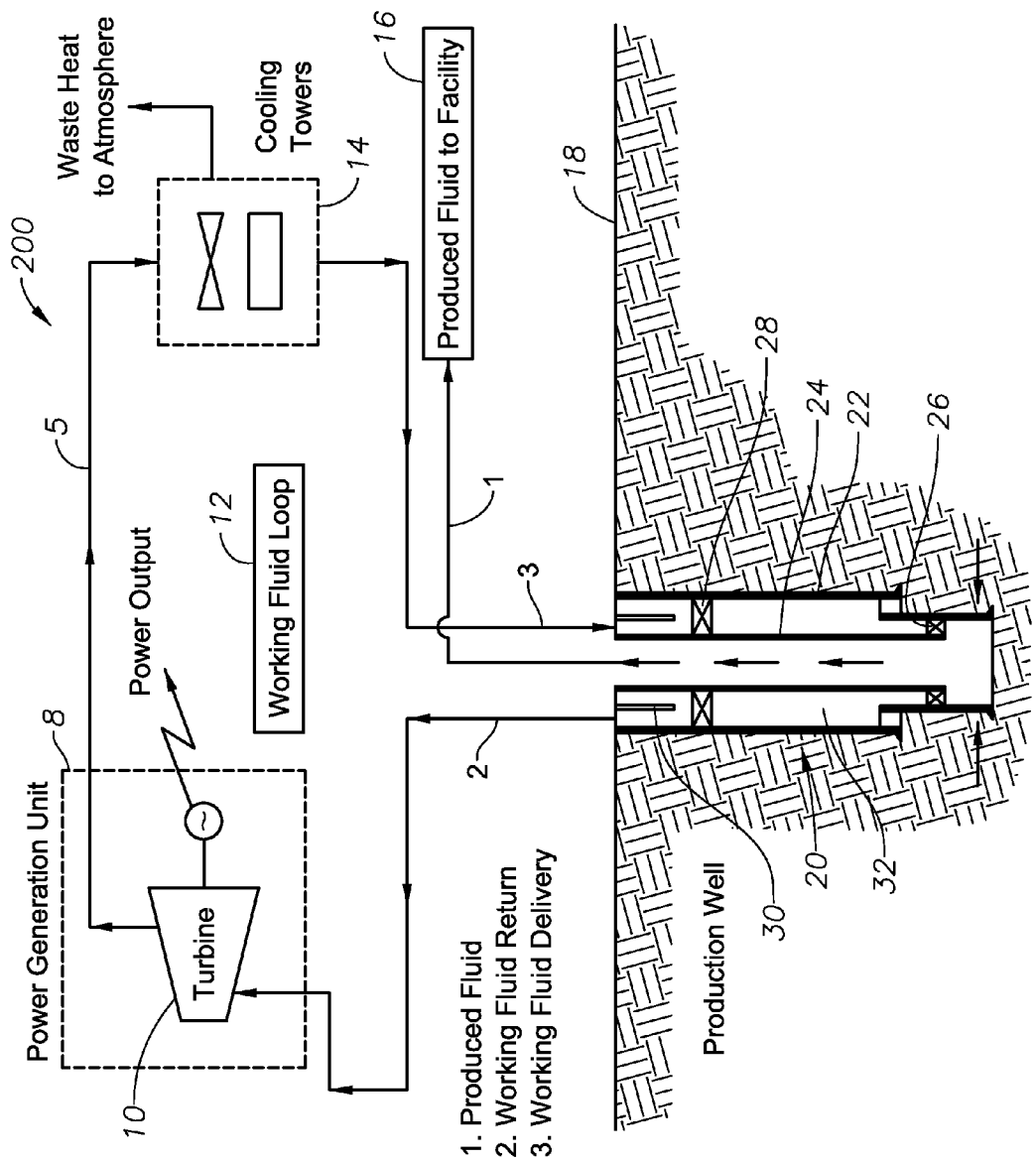
FIG. 2 schematically illustrates one embodiment of a system and method within the present disclosure.

In accordance with the present disclosure, FIG. 2 illustrates schematically one embodiment 200 of an Annular Circulation Co-production (ACC) system and method in accordance with the present disclosure. System 200 includes, in this embodiment, a production well 20 comprising a production casing 22 and a production tubing 24 positioned therein, forming an annulus therebetween. An isolation packer 28 is positioned in the annulus at a position sufficient to separate the annulus into a first portion above packer 28 and a second portion below packer 28. Production well 20 further comprises, in this embodiment, a tie-back conduit 30 positioned in the first portion of the annulus and configured to allow heat transfer between a working fluid flowing through the first, upper portion of the annulus and a production fluid stream 1 traversing through production tubing 24, thus separating the circulating working fluid from fluids in the second, lower portion of the annulus. A working fluid loop 12 is fluidly connected to the first, upper portion of the annulus, as will now be explained.

Unlike a hydrothermal system (or the classical co-produced system described earlier in reference to FIG. 1), the systems and methods of the present disclosure may present a more complex thermal problem. There are at least three flow streams to consider, and several parameters affect the thermal recovery. A thermal-hydraulic model for systems and methods of the present disclosure was developed to aid in the analysis of the present systems and methods, and to compare them to the classical binary-cycle based co-production system. In this section, we present the basis for the thermal-hydraulic model used herein, and equations used in the thermal-hydraulic model are reserved for the end of this disclosure.

Figure 3:
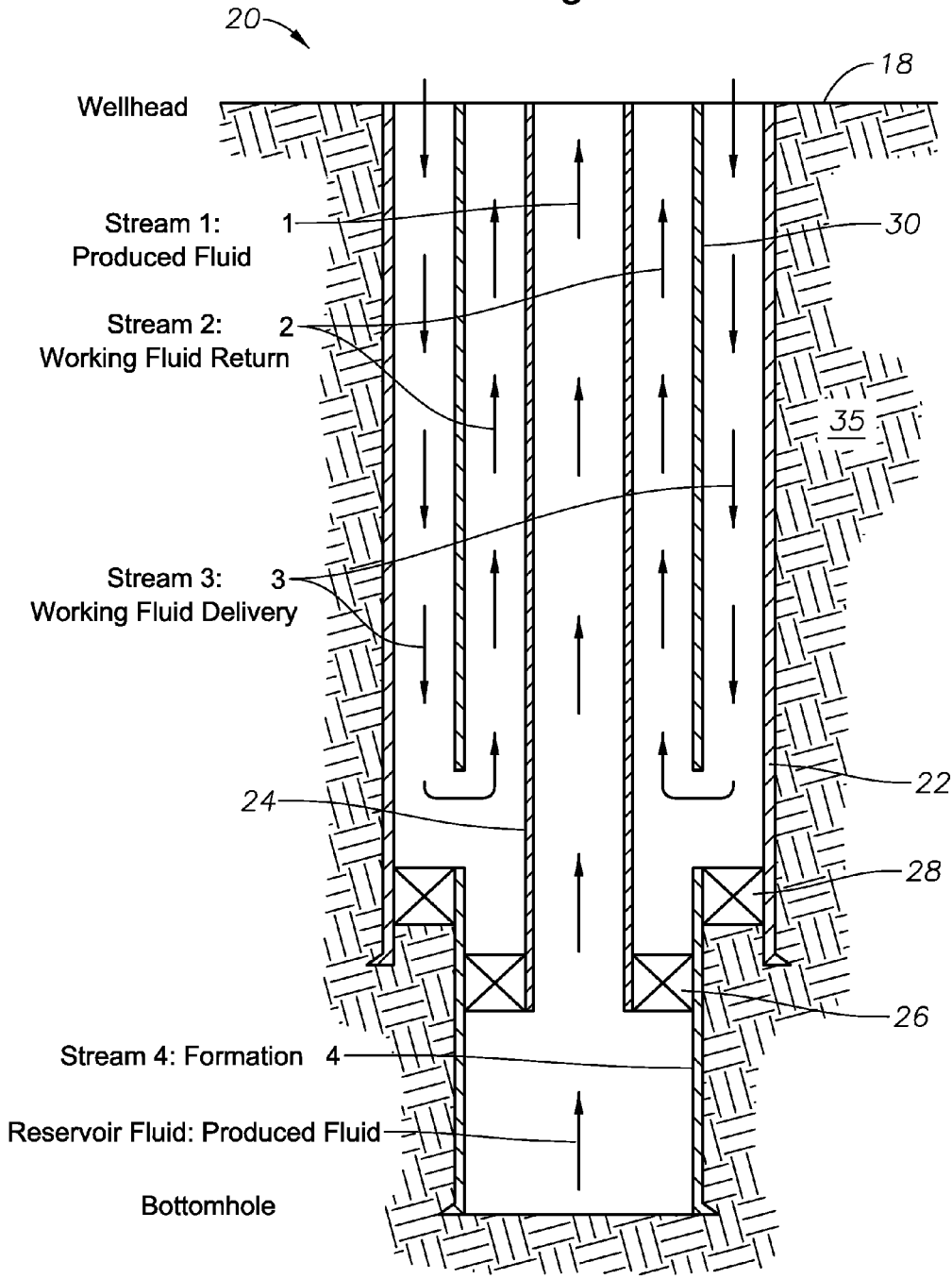
FIG. 3 schematically illustrates the thermal-hydraulic problem in embodiments of systems and methods in accordance within the present disclosure.

FIG. 3 illustrates a schematic of one ACC system and method in accordance with the present disclosure, illustrating the thermal problem. Four flow streams can be identified, depending upon flow and thermal conditions. The production fluid stream is divided into two flow stream sections as per the thermal conditions. The production fluid upflow in the downhole heat exchanger section of the wellbore is stream 1, which interacts with the return stream of the circulating working fluid, stream 2. The production fluid stream that interacts solely with the wellbore below the downhole heat exchanger and formation is stream 4. Finally, stream 3 is the working fluid stream flowing into the downhole heat exchanger.

Heat transfer between fluid stream 4 and formation 35 may be modeled using a heat transfer model, for example, but not limited to, the 1-dimensionsal quasi-steady heat transfer model first proposed by Ramey, H. J., 1962, *"Wellbore Heat Transmission,"* Journal of Petroleum Technology, April 1962, pp. 427-435, and since used in several wellbore thermal simulators. Ramey's method uses an electrical analogy to the thermal problem and defines an overall heat transfer coefficient in the wellbore section, coupled at the wellbore boundary to the transient heat conduction in the formation. In the multi-stream section of the wellbore, heat transfer between the downward flowing working fluid (stream 3) to formation 35 may also be modeled using the same approach. Heat transfer between flow streams 1 and 2 may be modeled using a heat transfer model, for example, but not limited to, the NTU-effectiveness method for a parallel flow heat exchanger (see for example, Hodge, B. K., 1990, *Analysis and Design of Energy Systems*, Second Edition, Prentice Hall, New Jersey). "NTU" means number of transfer units. Heat exchange between streams 2 and 3 (which reduces recovery) may be modeled using a heat transfer model, for example, but not limited to, a loss factor applied to the heat exchanger effectiveness (See the Summary of Equations and Theoretical Model, below). An energy balance then provides the heat transfer rates.

Frictional pressure losses may be modeled as well, using for example, but not limited by, models using standard viscous flow theory for pipes and conduits (Hodge, 1990). Gravitational gradient may be accounted for based on in-situ density calculated using a standard PVT model, for example, but not limited to the standard PVT model known under the trade designation REFPROP, a standard PVT model provided by NIST that covers several fluids, including many standard low boiling point working fluids (see for example, Lemmon, et. al., *"NIST Standard Reference Database 23: Reference Fluid Thermodynamic and Transport Properties-REFPROP, Version 9.0"*, National Institute of Standards and Technology, Standard Reference Data Program, Gaithersburg, Md., USA). Gravitational gradient is important in this problem to properly calculate thermal properties and capture the thermosiphoning effect on the working fluid.

The resulting coupled system of equations may be solved numerically. Key results from the model include the pressure, temperature and quality profile in the working fluid streams.

A surface system model may be employed to calculate the net power generated from the returning working fluid, stream 2. In certain embodiments, only the thermal energy in the working fluid is considered; in other words, in these embodiments the hydraulic horsepower and hydrocarbon energy in the produced fluid may therefore be excluded. In the surface system model of these embodiments, the turbine inlet state may be the exit state of the working fluid. The turbine exit state may be calculated using an isentropic assumption corrected with turbine efficiency. Turbine efficiency may be assumed to be about 85 percent for a gas turbine, and about 60 percent for a liquid turbine. Although in general, the desired exit state of the working fluid is vapor, in certain embodiments, a two-phase condition can arise, necessitating the inclusion of a liquid turbine model to appropriately reduce the energy recovery. The cooling system may be assumed to cool the working fluid to a pre-specified ambient temperature, with an assumed efficiency. If the conditions at the exit of the cooling system are not adequate to circulate the working fluid down the annulus, a parasitic pump may be added in certain embodiments to generate enough hydraulic energy to complete the circulation loop. In most embodiments, parasitic power is not required due to the beneficial effect of thermosiphoning. Power to grid may be calculated using the actual net work done in the cycle. A loss of about 6 percent may be assumed in certain embodiments in converting turbine output to electrical power. The thermal efficiency of the entire system may also be calculated and reported.

For the standard binary system, such as illustrated in FIG. 1, the problem may be solved for production only (i.e., the entire production flow stream is thermally identical to stream 4 of FIG. 3). The net power may then be estimated using the correlation provided by Sanyal et al., *"Geothermal Power Capacity from Petroleum Wells—Some Case Histories Of Assessment"*, Proceedings World Geothermal Congress 2010, Bali, Indonesia, April 2010. Unfortunately, Sanyal et al. only provided a graphical representation of this correlation, which was digitized for use in the present disclosure. The mean expectation from their correlation may be used. In cases where the power is within the specifications of a standard (off-the-shelf) binary unit, the manufacturer specifications may be used to verify the estimated net power. The model developed by NREL was found to be difficult to incorporate into our model at this stage.

A software tool (known under the trade designation BLADE GEOTHERMAL SIMULATOR (BGS), available from Blade Energy Partners Ltd., Frisco, Tex.) implementing the above model was constructed to aid in thermal-hydraulic analysis of different prospects and well designs. The program can handle most wellbore geometries (but in certain embodiments may be restricted to a maximum of three flow streams). Five different working fluids may be included in certain embodiments. Produced fluid may be water, oil, or gas, or combination thereof. Both binary and ACC systems may be modeled, as may systems with other flow path configurations, as long as a maximum of three flow streams are interacting in heat transfer relationship.

EXAMPLES

Results and Discussion

Model Verification

Figure 4:
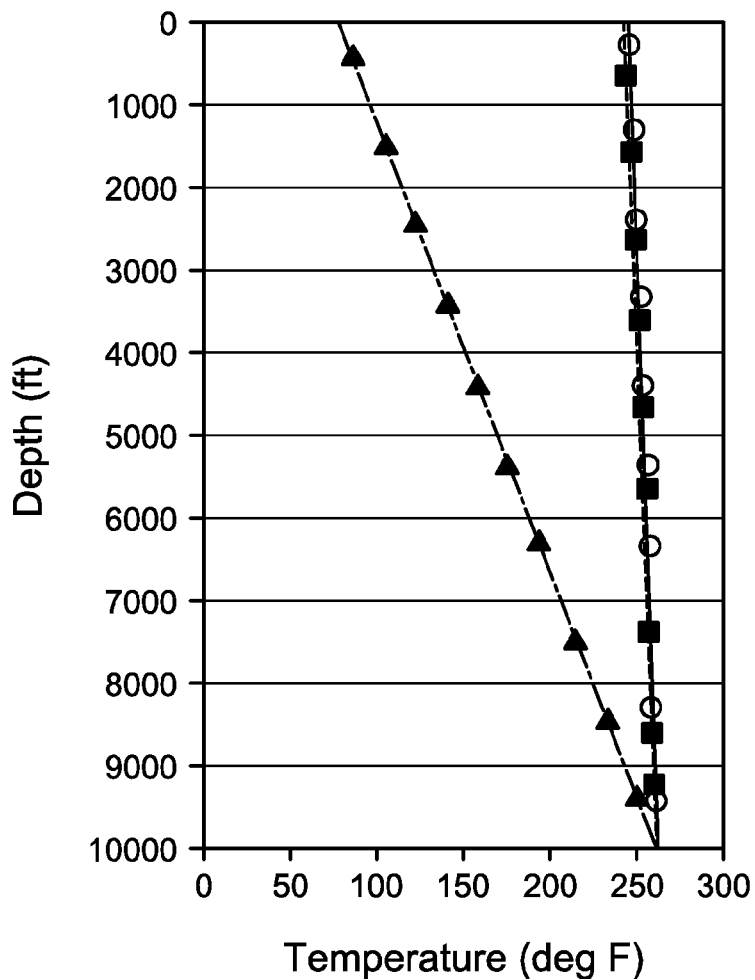
FIG. 4 is a graph illustrating a comparison of a model of the present disclosure with an industry-standard multiphase flow simulator for a standard production well.

In order to verify the model, results of the model were compared to those from, an industry-standard multiphase flow simulator known under the trade designation WELL-FLO8. A standard production well was used for the comparison, with the following assumptions:

Vertical Well
Reservoir depth=10,000 ft
Produced Fluid=Water
Flowrate=10,000 BPD
Bottomhole Temperature=260° F.
Bottomhole Pressure=4150 psi
Production through 7 inch, 32 ppf casing Results of the comparison are illustrated in FIG. 4 and Table 1. As the results show, the comparison is excellent.

TABLE 1

Exit temperature and pressure comparison

|  | BGS | WELLFLO 8 |
|---|---|---|
| Surface Temperature (° F.) | 245.4 | 242.2 |
| Surface Pressure (psi) | 48 | 58 |

The model was also verified against actual results from the Ormat binary power generating unit at the Rocky Mountain Oilfield Testing Center (RMOTC). The geometry and conditions were set to the data available on the RMOTC wells (see Johnson et al., "*Produced Water from NPR-3 Oil and Gas Wells for Low Temperature Geothermal Application*", Paper provided to authors; and Johnson, L. A., 2010, *"Testing of ORMAT Technology's Low-Temperature Geothermal Application"*, presented at the Geothermal in the Oil Field Symposium, Casper, Wyo., August 2010).

The RMOTC system includes 10 wells producing a total of up to 50,000 bpd of water, and has demonstrated the ability to generate approximately 200 KW-300 KW using the Ormat binary plant. The production fluid exit temperature predicted by the above model (for a single average well) is compared to the measured temperatures. Results are summarized in Table 2, and are within 2° F. of the measured exit temperature.

TABLE 2

Surface temperature comparison-RMOTC single well

|  | BGS | WELLFLO 8 | Field Data |
|---|---|---|---|
| Surface Temperature (° F.) | 200.1 | 199.8 | 198 |

As a special case, the RMOTC system was modeled as an ACC system with a downhole heat exchanger. The assumptions for this analysis are shown in Table 3.

TABLE 3

Assumptions for RMOTC Single Well using Alternative Well Design

| | | |
|---|---|---|
| PF Flowrate (BPD) | 5,000 | |
| Reservoir Depth (ft) | 5,400 | |
| Circulation Depth (ft) | 2,000 | |

| Tubulars | OD (in) | ID (in) |
|---|---|---|
| Tubing (PF) | 4.500 | 3.826 |
| Working Fluid Return | 7.000 | 6.094 |
| Working Fluid Delivery | 9.625 | 8.535 |
| Bottom Section (PF) | 7.000 | 6.094 |

| Reservoir Fluid | Temperature (° F.) | SIBHP (psi) | PI (gpm/psi) |
|---|---|---|---|
| Water | 210 | 2,450 | 2.5 |

For the assumptions in Table 3, the ACC system generates 63 kW net per well, or about 13 kW per bbl/day, which is comparable to the results for a binary system according to the correlation from Sanyal et al.

Example Well with Alternative Design

The above model was applied to an example well with an ACC system design to conduct a wide-ranging parametric sensitivity analysis. The results illustrated the thermal recovery potential of the proposed concept, as well as the impact of different design parameters on thermal energy recovery. It should be noted that in all of the analysis and results presented in what follows, the thermal or hydraulic energy from the hydrocarbons was not considered—only the thermal energy recovery was calculated. The energy from the produced hydrocarbons is an additive energy term that is common to both the binary system and the ACC system.

Figure 5:
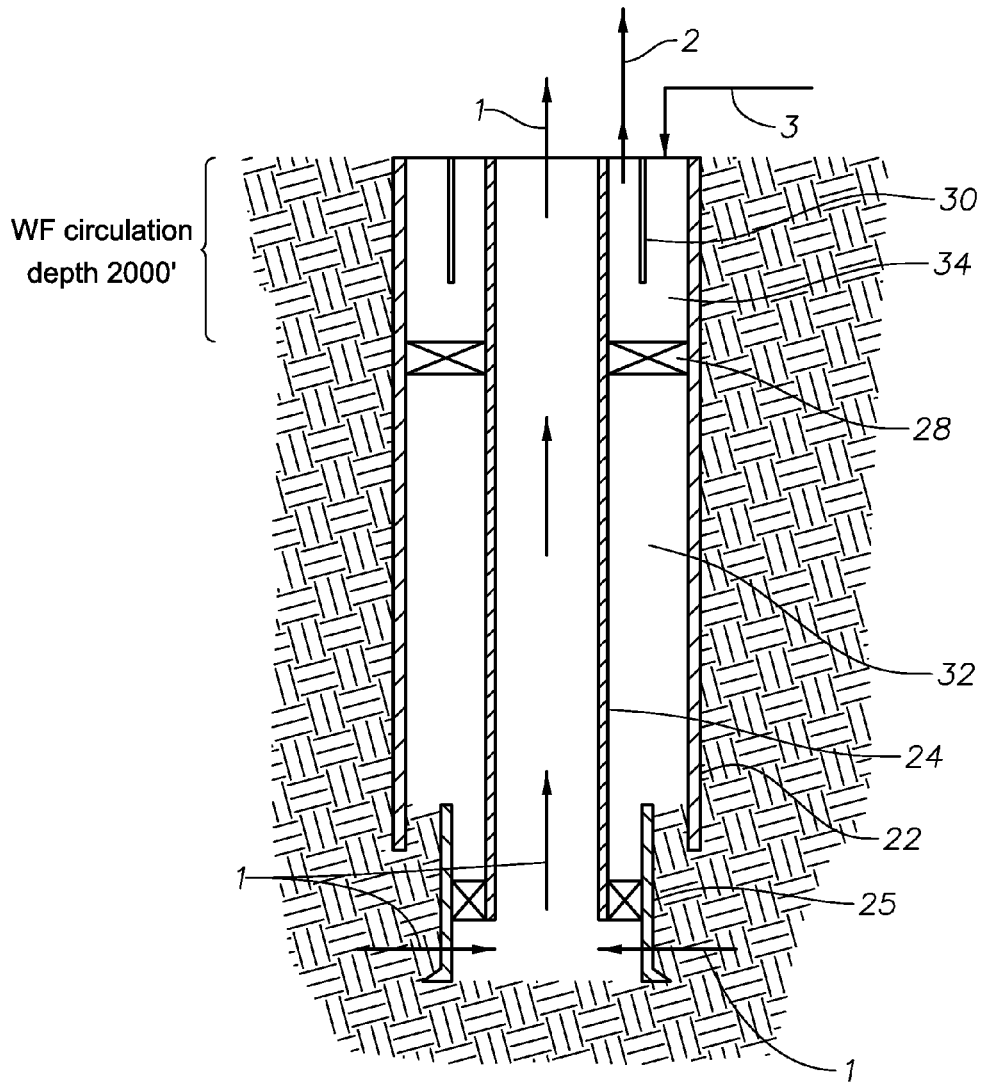
FIG. 5 is a schematic side elevation view of one possible geometry and wellbore configuration for practicing systems and methods within the present disclosure.

The assumed geometry and wellbore configuration is shown in FIG. 5. The key assumptions in the example well are summarized in Table 4. It followed a well completion typical in many oil and gas wells, with a 9⅝ inch production casing, 7 inch production liner across the reservoir, and 4½ inch production tubing with packer set in the liner. The reservoir was 10,000 ft, and was at a temperature of 260° F. The production casing and liner were assumed to be fully cemented. Formation thermal properties were assumed to be constant. Results from different parametric sensitivity studies are presented in what follows.

TABLE 4

Base Assumptions for the Example Well

| | | |
|---|---|---|
| Reservoir Depth (ft) | 10,000 | |
| Circulation depth (ft) | 2,000 | |

| Tubular | OD (in) | ID (in) |
|---|---|---|
| Tubing (PF) | 4,500 | 3.826 |
| Working fluid return | 7.000 | 6.538 |

TABLE 4-continued

Base Assumptions for the Example Well

| | | |
|---|---|---|
| Working fluid delivery | 9.625 | 8.535 |
| Bottom Section (PF) | 7.000 | 6.538 |

| Reservoir Fluid | Temperature (° F.) | SIBHP (psi) | PI (gpm/psi) |
|---|---|---|---|
| Water | 260 | 4,500 | 2.5 |

Isobutane Working Fluid, Varying Production and Working Fluid Rates

Figure 6:
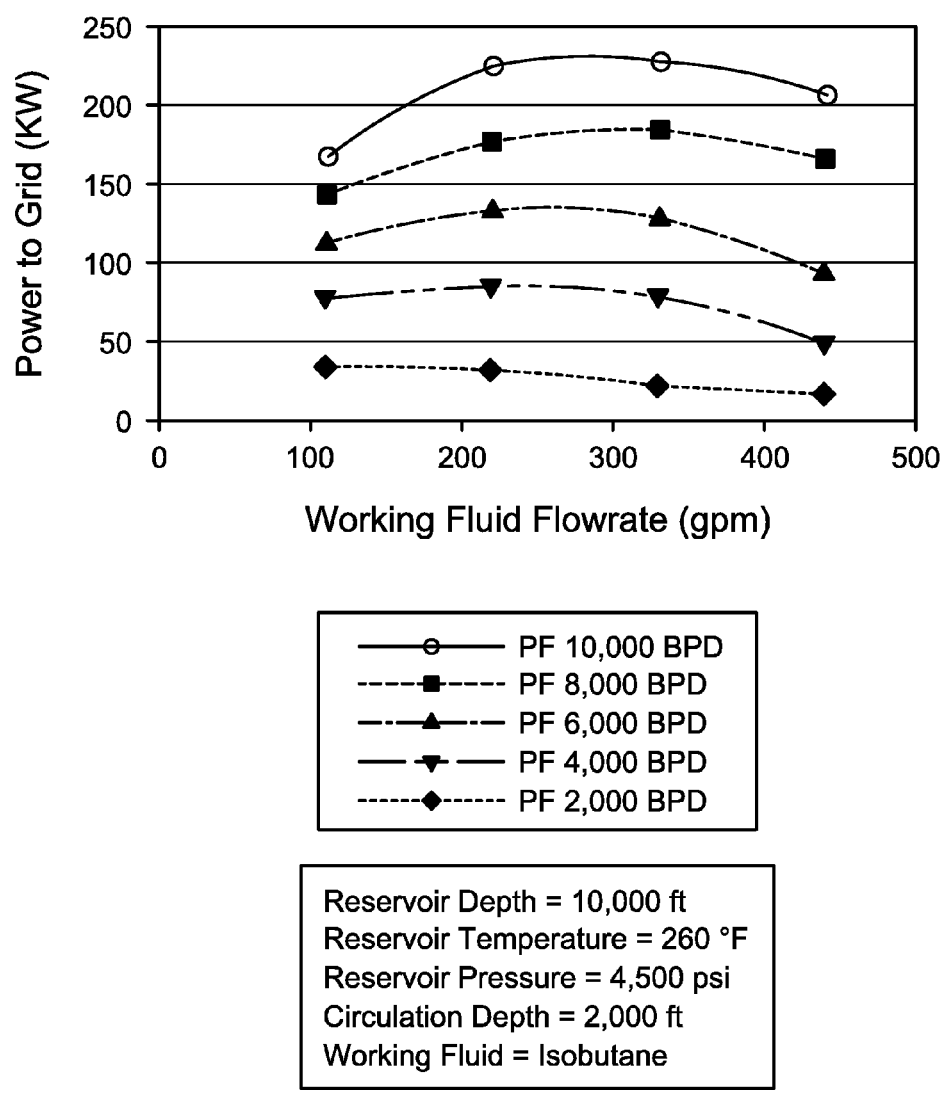
FIG. 6 is graphical representation of power generation results for production fluid rate varying from a maximum of 10,000 BPD to a minimum of 2,000 BPD, using isobutane as a working fluid, in a system and method of the present disclosure using the geometry and wellbore configuration of FIG. 5.

The energy recovery potential depends upon the production rate, as noted earlier. In ACC systems and methods of the present disclosure, the working fluid rate may be selected to optimize the energy generated. We therefore investigated the effect of varying production rates (simulating decline of production) and working fluid injection rate. Water was the produced fluid, and isobutane was the working fluid. The depth of circulation was fixed at 2,000 ft. FIG. 6 shows the results for production rate varying from a maximum of 10,000 BPD to a minimum of 2,000 BPD. As the figure shows, energy declined with production rate. More interestingly, we observed that for each production rate, there was an optimum working fluid rate that "matched" the production rate and optimized the energy recovery. At 10,000 BPD, the power to grid was 240 KW, or 24 W per bbl/day, if the working fluid rate was maintained at 220 gpm. This compared favorably to the 26 W per bbl/day predicted using the Sanyal et al. correlation for co-produced geothermal energy using a binary cycle.

Effect of Resource Temperature

Figure 7:
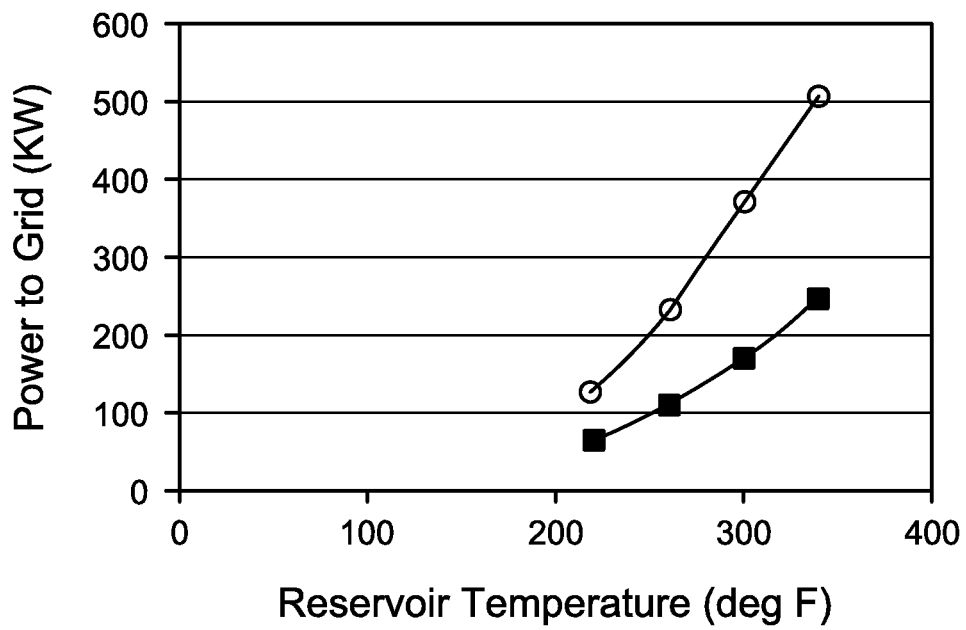
FIG. 7 is a graphical representation of power generation results for the effect of varying the reservoir temperature on the energy recovery using isobutane as a working fluid, in a system and method of the present disclosure using the geometry and wellbore configuration of FIG. 5.

We then looked at the effect of varying the reservoir temperature on the energy recovery using an ACC system. In this analysis, the working fluid rate was held constant at 325 gpm, and isobutane was used as working fluid. FIG. 7 illustrates the results. The energy output increased with increasing temperature. At 340° F. reservoir temperature, 500 KW can be generated (50 W per BPD). It should be noted that this output may be further optimized by varying the working fluid rate and type.

Effect of Circulation Depth and Working Fluid Type

Figure 8:
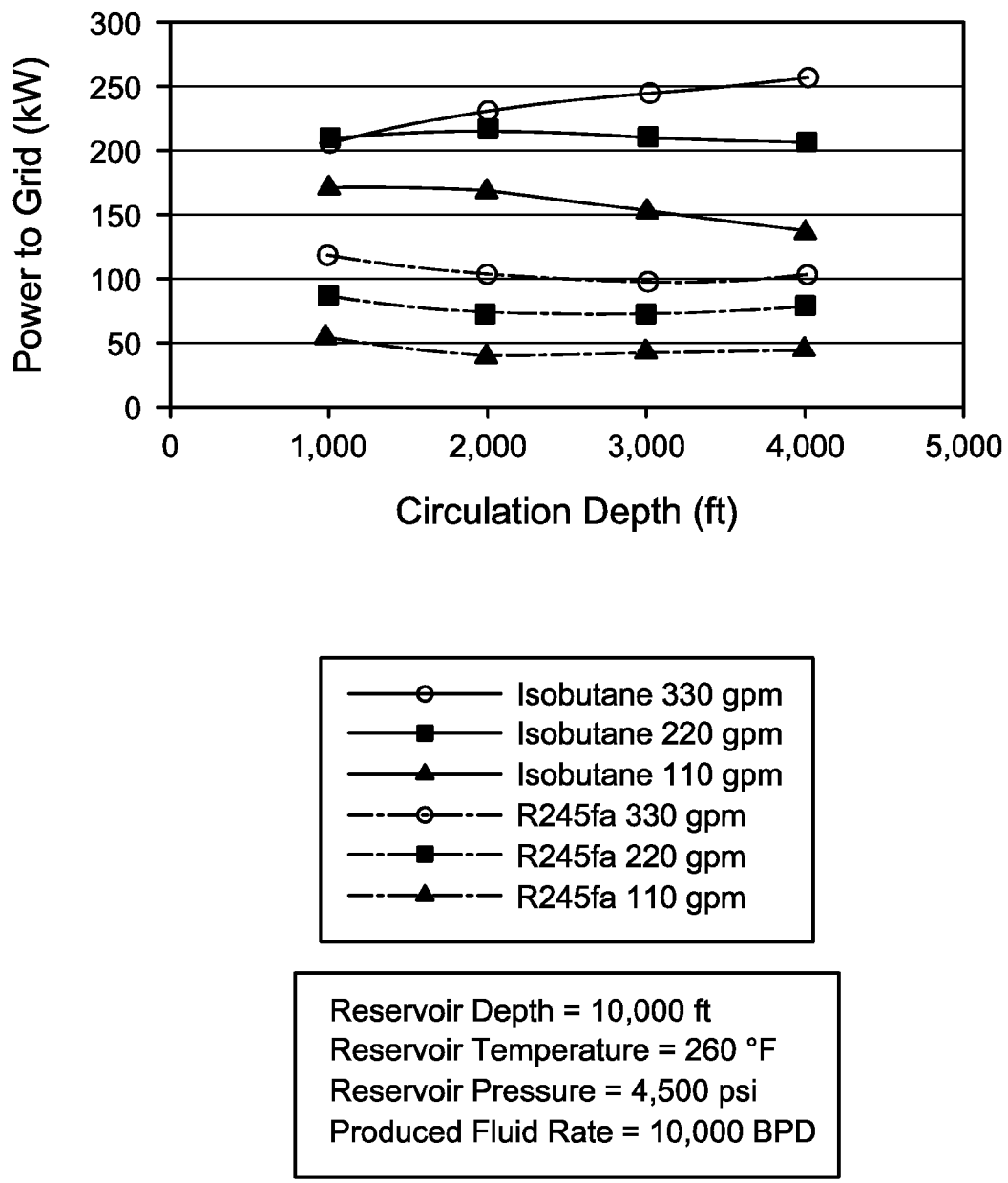
FIG. 8 is a graphical representation of power generation results for isobutane and R245fa refrigerant used as working fluid, as well as the effect of changing circulation depth (and hence downhole heat exchanger length) and working fluid flow rate on the energy recovery using isobutane as a working fluid, in a system and method of the present disclosure using the geometry and wellbore configuration of FIG. 5.

As noted earlier, the model allows for the consideration of five common working fluids. We investigated the effect of changing the type of working fluid for our example well. FIG. 8 illustrates the results using isobutane as working fluid (as previously discussed) and a refrigerant known under the trade designation R245fa, a refrigerant that is sometimes recommended as a working fluid for geothermal plants. Also shown is the effect of changing circulation depth (and hence downhole heat exchanger length) and working fluid flow rate. As the circulation depth increased, the NTU of the heat exchanger increased, until it reached a maximum. Working fluid vaporization may occur early in the upflow, reducing the heat transfer to the vapor phase, and hence total energy recovered. Increasing the depth also increased the friction loss in the working fluid loop, and may require a parasitic pump. As may also be seen, in all cases, isobutane appeared to be a much better choice for a working fluid for the example case. This may however not be always the case, and a case-specific selection is necessary to optimize energy recovery.

Effect of Other Parameters

Several other parametric sensitivities were also investigated as part of this study. Clearly, variations in the annular geometry (by varying the size of the circulation loop tieback), and hence in the velocities of streams 2 and 3, may significantly impact net energy recovery. Surface pump pressure may also impact the thermal energy recovery, and is included in some of the parametric cases reported herein.

Downhole Pumping Alternatives

During the late 1970's and early 1980's, Hugh B. Matthews, working for Sperry Corporation, received a number of patents for a system to incorporate a downhole turbine lift pump in the well design that would use a circulating working fluid to power the reservoir fluid lift pump. A commercial application of this technology is currently under development by Geotek Energy. This type of system could be used for lifting produced fluid in wells with low wellhead pressure. This type of pump system will need to compete with other pumping alternatives like ESP (Electric Submersible Pump) or surface-driven shaft pumps. However, this type of pump system may offer advantages over more traditional pumping systems. Some of the advantages may be deeper installation depths over shaft driven pumps and the elimination of the need to transmit electrical power downhole. There is currently at least one hydraulically-powered downhole pump system used in oil and gas operations. However, there are no downhole fluid-driven turbine pump systems currently available for this type of application.

Several additional types of equipment may need to be designed to successfully install this type of system. Some of these may be a) annular packer and pump support, b) surface-actuated downhole valve, c) downhole pump system seal assembly, d) hanger, wellhead and wellhead spools for the multiple fluid flow paths, e) surface safety systems to handle the surface pressure in the event of a downhole seal failure, and f) surface and downhole equipment to recover and store the working fluid.

The capability of ACC systems and methods in accordance with the present disclosure to use the heat energy of the produced fluid to lift fluid from a low pressure reservoir may be an economic winner. However, the technical complexity of this problem may be sufficient to require equipment development and field demonstrations before it may be accurately compared to current geothermal energy recovery alternatives.

Economic Considerations for ACC Systems and Methods

Installation of an ACC System in an existing well may incur the cost of a workover. Additional costs for an existing well or new well may include the following.

Annular tieback string

Downhole turbine pump, if used

Annular packer and possible downhole valve

Special wellhead, spools and valves

Possible safety equipment in case of a downhole packer leak to the working fluid stream Working fluid costs (for required annular and surface inventory)

Surface power turbine may be lower cost due to the lack of a heat exchanger for a typical binary type of system Since the electrical power generating system will not be exposed to the produced fluids, no special materials would be required for wells with a corrosive fluid chemistry.

Well workover costs may be somewhat higher due to the handling of the additional string of casing.

Risk Considerations for ACC Systems and Methods

ACC systems and methods may have an additional capital cost with associated Operating & Maintenance cost component. There may also be the risk of loss of the working fluid downhole. This cost could be significant depending on the type of working fluid. Clearly, use of fluids such as isobutane, with their associated low cost, may be beneficial in this regard. The benefit from not having to handle the produced fluid directly in the surface energy system should also be considered in the risk considerations. Tubing leak load consideration is also important, since the upper part of the A annulus has been modified. Although the production casing is already designed to handle the tubing leak load, the surface system may not. Therefore, a safety system disallowing the flow of produced fluid into the surface system will be desired to mitigate risks. This may add cost to overall ACC systems and methods.

We have proposed alternative well designs for use in the co-production of geothermal energy from oil and gas wells. The alternative ACC systems and methods described in this paper may have several advantages that extend the range of co-production to oil and gas wells not normally considered as attractive for thermal energy recovery, due to production conditions. We have also developed thermal-hydraulic models that may be useful in the analysis of co-production prospects, and in providing thermodynamic assurance. The tools may be used in determining thermal energy recovery for a great number of resource and different well design and surface system alternatives. It may help operators in the assessment of different prospects. Ongoing research and development is focused on extending the tools to cover other alternatives for working fluid, well design, and production conditions.

A wide-ranging parametric sensitivity analysis has been presented to illustrate certain aspects of certain system and method embodiments, and compare them to typical binary cycle co-production systems. Results indicate that energy recovery from proposed ACC systems and methods was comparable to that from classical binary cycle based systems. Results also showed that the energy recovery may be increased by suitably choosing the different design and operating parameters that affect the problem. Although the new systems and methods may have additional costs associated with well workover and additional equipment, they offer several advantages, including isolation from the production system, and tolerance to decline of primary hydrocarbon production. Finally, although quantitative results for the use of the gravity head of the circulating working fluid to drive a turbine lift pump have not been presented, the possibility of this variation offers an attractive choice for marginal hydrocarbon field operators to increase production rates.

Figure 9:
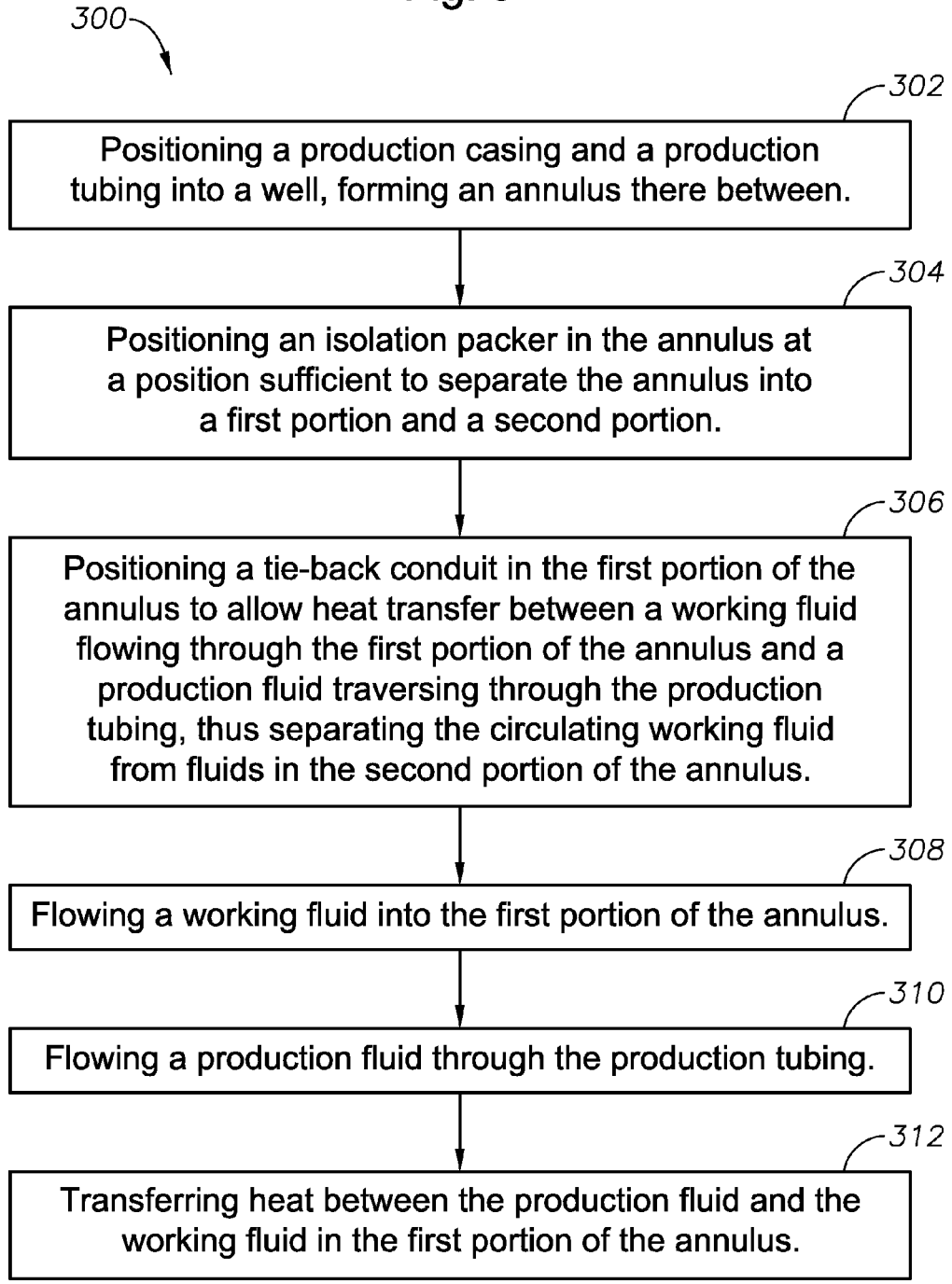
FIGS. 9-11 are logic diagrams of three method embodiments in accordance with the present disclosure.
Figure 10:
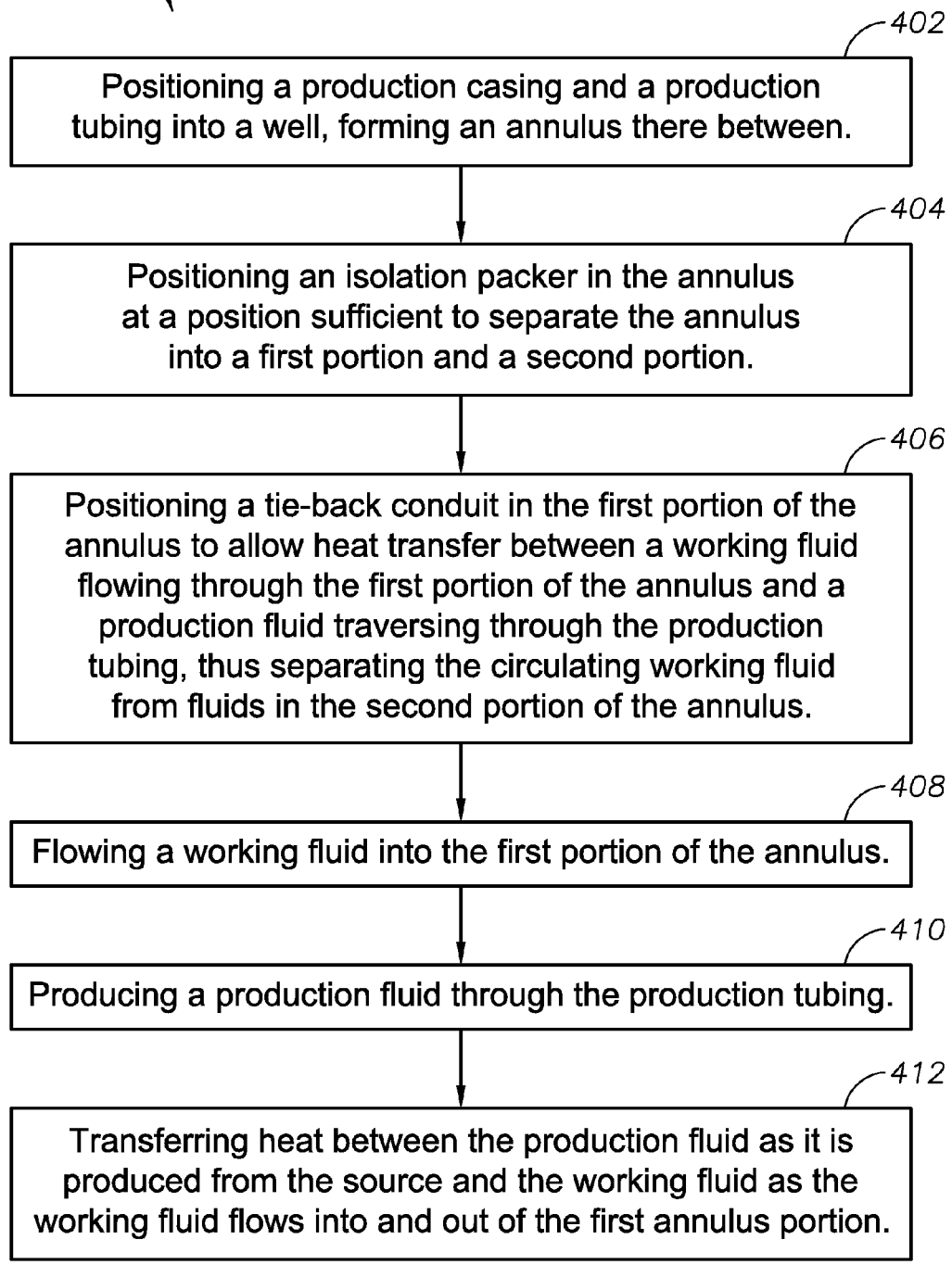
Figure 11:
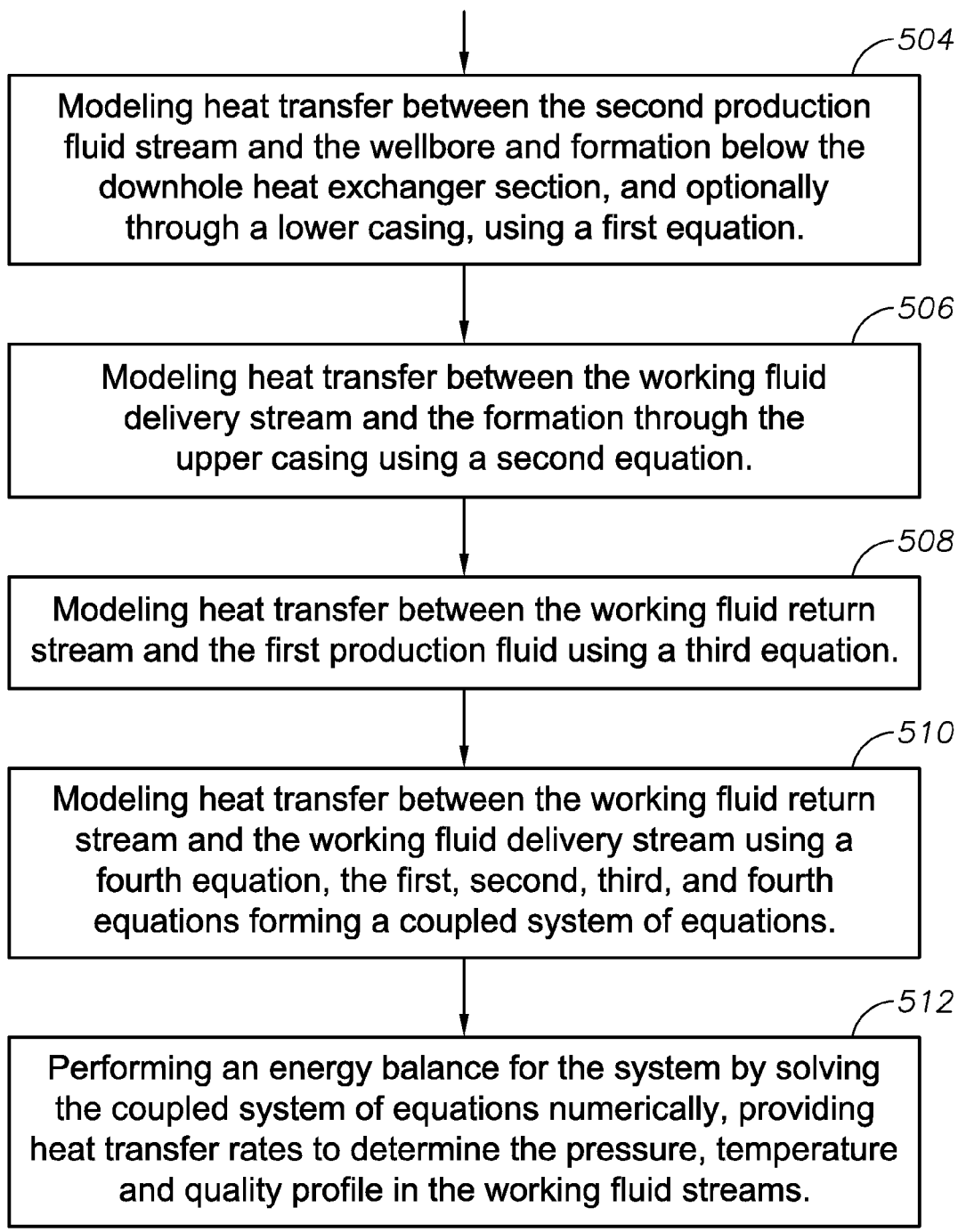

FIGS. 9-11 are logic diagrams of three method embodiments in accordance with the present disclosure. Method embodiment 300 illustrated in FIG. 9 is one embodiment of a method of producing a fluid from a subterranean source, the method comprising the steps of positioning a production casing and a production tubing into a well, forming an annulus there between (box 302); positioning an isolation packer in the annulus at a position sufficient to separate the annulus into a first portion and a second portion (box 304); positioning a tie-back conduit in the first portion of the annulus to allow heat transfer between a working fluid flowing through the first portion of the annulus and a production fluid traversing through the production tubing, thus separating the circulating working fluid from fluids in the second portion of the annulus (box 306); flowing a working fluid into the first portion of the annulus (box 308); flowing a production fluid through the production tubing (box 310); and transferring heat between the production fluid and the working fluid in the first portion of the annulus (box 312).

FIG. 10 illustrates another method embodiment 400, which is another method of producing a fluid from a subterranean source. In embodiment 400, a first step comprises positioning a production casing and a production tubing into a well, forming an annulus there between (box 402); positioning an isolation packer in the annulus at a position sufficient to separate the annulus into a first portion and a second portion (box 404); positioning a tie-back conduit in the first portion of the annulus to allow heat transfer between a working fluid flowing through the first portion of the annulus and a production fluid traversing through the production tubing, thus separating the circulating working fluid from fluids in the second portion of the annulus (box 406); flowing a working fluid into the first portion of the annulus (box 408); producing a production fluid through the production tubing (box 410); and transferring heat between the production fluid as it is produced from the source and the working fluid as the working fluid flows into and out of the first annulus portion (box 412).

Another method embodiment 500 is illustrated in logic diagram format in FIG. 11. Embodiment 500 comprises a method of modeling an annular circulation co-production system. The first step of method embodiment 500 comprises the step of identifying flow streams, depending upon flow and thermal conditions, the flow streams comprising at least a production fluid stream divided into first and second production fluid streams as per the thermal conditions, the first production fluid stream flowing through a production tubing of a downhole heat exchanger section of a wellbore, a working fluid return stream which thermally interacts with the first production fluid stream through the production tubing, the second production fluid stream thermally interacting solely with the wellbore and formation below the downhole heat exchanger section, optionally through a lower casing, and a working fluid delivery stream flowing into and through the downhole heat exchanger section, wherein the downhole heat exchanger section comprises an annulus between the production tubing and an upper casing, the annulus divided by an isolation packer positioned in the annulus at a position sufficient to separate the annulus into a first portion and a second portion, and a tie-back conduit positioned in the first portion of the annulus and configured to allow heat transfer between the working fluid return stream flowing through the first portion of the annulus and the first production fluid stream traversing through the production tubing, thus separating circulating working fluid from fluids in the second portion of the annulus (box 502); modeling heat transfer between the second production fluid stream and the wellbore and formation below the downhole heat exchanger section, and optionally through a lower casing, using a first equation (box 504); modeling heat transfer between the working fluid delivery stream and the formation through the upper casing using a second equation (box 505); modeling heat transfer between the working fluid return stream and the first production fluid using a third equation (box 508); and modeling heat transfer between the working fluid return stream and the working fluid delivery stream using a fourth equation, the first, second, third, and fourth equations forming a coupled system of equations (box 510). Method 500 then comprises performing an energy balance for the system by solving the coupled system of equations numerically, providing heat transfer rates to determine the pressure, temperature and quality profile in the working fluid streams (box 512).

The systems and methods of the present disclosure are scalable over a wide range of depths, well pressures and conditions.

In general, the production tubing may have an outer diameter (OD) ranging from about 1 inch up to about 50 inches (2.5 cm to 127 cm), or from about 2 inches up to about 40 inches (5 cm to 102 cm), or from about 4 inches up to about 30 inches (10 cm to 76 cm), or from about 6 inches up to about 20 inches (15 cm to 51 cm).

For subsea systems and methods, the past several years has seen the development of a comprehensive 15/20 Ksi (103/138 MPa) dry tree riser qualification program which focuses on demonstrating the suitability of using high strength steel materials and specially designed thread and coupled (T&C) connections that are machined directly on the riser joints at the mill. See Shilling et al., "*Development of Fatigue Resistant Heavy Wall Riser Connectors for Deepwater HPHT Dry Tree Riser Systems*", OMAE2009-79518. These connections may eliminate the need for welding and facilitate the use of high strength materials like C-110 and C-125 metallurgies that are NACE qualified. (As used herein, "NACE" refers to the corrosion prevention organization formerly known as the National Association of Corrosion Engineers, now operating under the name NACE International, Houston, Tex.) Use of high strength steel and other high strength materials significantly reduces the wall thickness required, enabling riser systems to be designed to withstand pressures much greater than can be handled by X-80 materials and installed in much greater water depths due to the reduced weight and hence tension requirements. The T&C connections may eliminate the need for third party forgings and expensive welding processes—considerably improving system delivery time and overall cost. It will be understood, however, that the use of third party forgings and welding is not ruled out, and may actually be preferable in certain situations. The skilled artisan, having knowledge of the particular depth, pressure, temperature, and available materials, will be able design the most cost effective, safe, and operable system for each particular application without undue experimentation.

The production tubing, casing, and the primary components of the surface systems described herein (flow conduits, connectors, adapters, and the like) are largely comprised of steel alloys. While low alloy steels may be useful in land operations and certain subsea embodiments where water depth is not greater than a few thousand (for example 5000) feet (about 1524 meters), activities in water of greater depths, with wells reaching 20,000 ft. (about 6000 meters) and beyond may be expected to result in operating temperatures and pressures that are well above those presently allowed in current API specifications. In these "high temperature, high pressure" (HPHT) applications, high strength low alloy steel metallurgies (such as X-100, C-110, Q-125, C-125, V-140), Titanium (such as Grade 29 and possibly newer alloys) may be appropriate.

Summary of Equations and Theoretical Model

FIG. 3 illustrates the thermal-hydraulic problem. With reference to FIG. 3, the 1-D quasi-steady heat conduction from stream 3 & 4 to the surrounding formation is based on Ramey's approach [Ramey, 1962]. The governing equations are:

Heat lost by fluid=Heat gained by formation $$\dot{m}C_p \Delta T_f - \dot{m}C_p C_j \Delta P_f = U_{ij} A_i (T_e - T_f) \quad (1)$$

where, $\dot{m}$ is the mass flowrate, $C_p$ is the specific heat at constant pressure, $C_j$ is the Joule-Thompson coefficient, and $T_f$ is the temperature of the fluid stream.

For single phase fluids, $C_j = 0$.

In eq. (1), $U_{ij}$ is the overall heat transfer coefficient between the fluid stream and the formation and $A_i$ is the cross-sectional area for the fluid stream.

The overall heat transfer coefficient is defined as [Ramey, 1962]:

$$U_{ij} = \left[ \frac{1}{h_i} + \frac{d_{in} \ln\left(\frac{d_{out}}{d_{in}}\right)_{casing}}{2k_{casing}} + \frac{d_{casing}}{d_{tubing} h_{nc}} + \frac{d_{in} \ln\left(\frac{d_{out}}{d_{in}}\right)_{cement}}{2k_{cement}} + \frac{\tau_e d_{in}}{2k_e} \right]^{-1} \quad (2)$$

where, $h_i$ is the heat transfer coefficient of fluid stream, $d_{in}$ and $d_{out}$ are the casing inside and outside diameters respectively, $k_{casing}$ is the thermal conductivity of the casing string, $d_{cement}$ is the borehole diameter, $k_e$ is the formation thermal conductivity, $h_{nc}$ is the natural convection heat transfer coefficient for the packer fluid, defined in Willhite (1967) and Hodge (1990), and $\tau_e$ is the Ramey's transient function [Ramey, 1962].

Ramey's transient function ($\tau_e$) for steady state is given by:

$$\tau_e(t) = -\ln\left(\frac{r_{bh}}{2\sqrt{\alpha t}}\right) - 0.29 \quad (3)$$

Note that, eq. (2) only considers a production casing string for the produced fluid flowing up to the circulation depth. When additional strings in the wellbore are considered, additional resistance terms enter eq. (2).

Heat transfer coefficient of the fluid stream is defined as:

$$h = Nu \frac{k}{d_h} \quad (4)$$

Here, k is the thermal conductivity of fluid, $d_h$ is the hydraulic diameter and Nu is the Nusselt number for the fluid stream, defined as:

$$Nu = 0.023 Re^{0.8} Pr^{0.3} \quad (5)$$

where Re is the Reynolds number and Pr is the Prandtl number [Hodge, 1990].

Pressure gradient for the fluid stream is calculated as:

$$\Delta P_{total} = \Delta P_{friction} + \Delta P_{hydraulic} \quad (6)$$

where, $$\Delta P_{fric} = \frac{1}{2} f \rho v^2 \frac{dz}{D_h}, \text{ and } \Delta P_{hyd} = \rho g dz \quad (7)$$

In eq. (7), $\rho$ is a state variable obtained from the PVT model REFPROP [Lemmon, 2010] as a function of P, h or P, T (depending upon the phase condition).

Heat transfer between produced fluid stream (1) and working fluid return stream (2) is modeled as parallel flow heat exchanger using the effectiveness-NTU method [Hodge, 1990]. Heat exchanger effectiveness is defined as:

$$\varepsilon = \frac{\text{Actual heat transferred}}{\text{Maximum heat that can be transferred}} \quad (8)$$

$$Q_{actual} = \varepsilon Q_{Max} = \varepsilon C_{min}(T_{hin} - T_{cin}) \quad (9)$$

where, $$C = \dot{m} \& C_P \quad (10)$$

In our thermal-hydraulic model heat transfer between working fluid streams 2 and 3 is ignored, so a correction factor ($\eta$) is used to account for any heat loss due to heat transfer between stream 2 and stream 3, as shown below:

$$Q_{actual} = \eta \epsilon C_{min}(T_{hin} - T_{cin}), \eta \leq 1 \quad (11)$$

For a parallel flow heat-exchanger effectiveness and NTU are defined as [Hodge, 1990]:

$$\varepsilon = \frac{1 - \exp\left[-\left(1 + \frac{C_{min}}{C_{max}}\right)NTU\right]}{1 + \frac{C_{min}}{C_{max}}} \quad (12)$$

$$NTU = \frac{UA}{C_{min}} \quad (13)$$

where,
U is the overall heat transfer coefficient between fluid streams 1 and 2 defined as:

$$U_{12} = \left[\frac{1}{h_1} + \frac{d_{in}\ln\left(\frac{d_{out}}{d_{in}}\right)_1}{2k_{casing}} + \frac{d_{in1}}{h_2 d_{out1}}\right]^{-1} \quad (14)$$

and A is the heat transfer cross-section area, $A = \pi d_1 \Delta z$.

Turbine efficiencies ($\eta_T$) of 85% and 60% are assumed for the vapor turbine and liquid turbine respectively. Liquid turbines may be theoretically necessary if during the parametric studies, the working fluid returns as a 2-phase fluid in some cases. In practice, the system design is such that the working fluid returns as vapor, so that only the vapor turbine is necessary.

Turbine work is calculated as:

$$W_{Turbine} = \eta_T \dot{m}(h_{s,out} - h_{in}) \quad (15)$$

Turbine work done is converted to power to grid using a 6% loss factor.

Thermal Efficiency of System
Two efficiencies are defined:

$$\text{Carnot Efficiency} = 1 - \frac{T_{inj}}{T_{wh\ return}} \quad (16)$$

$$\text{System Efficiency} = \frac{\text{Power generated}}{\text{Total energy gain by } WF} \quad (17)$$

where,
$T_{inj}$ is the working fluid injection temperature and $T_{wh\ return}$ is the temperature of the working fluid return stream at the wellhead.

Note that the temperatures used in eq. (17) are absolute temperatures.

As expected thermodynamically, we observe in our model that System efficiency is less than Carnot efficiency. As an example, for the case described in Table 4, we get: a Carnot efficiency of 11%, and System efficiency of 8%.

REFERENCES

AAPG, 1972, "Oil/Gas Well Database, Location of Texas Geothermal Resources", American Association of Petroleum Geologists.

Augustine, C., and Falkenstern, D., "National Co-produced Fluids Resource Estimate", presented at the Geothermal in the Oil Field Symposium, Casper, Wyo., August 2010.

Erkan, K., Holdmann, G., Benoit, W., and Blackwell, D., 2008, "Understanding the Chena Hot Springs, Alaska, geothermal system using temperature and pressure data", *Geothermics* 37 (6): 565-585.

Hodge, B. K., 1990, *Analysis and Design of Energy Systems*, Second Edition, Prentice Hall, New Jersey.

Johnson, L. A., and Schochet, D. N., 2009, "Produced Water from NPR-3 Oil and Gas Wells for Low Temperature Geothermal Application" Paper provided to authors.

Johnson, L. A., 2010, "Testing of ORMAT Technology's Low-Temperature Geothermal Application", presented at the Geothermal in the Oil Field Symposium, Casper, Wyo., August 2010.

Lemmon, E. W., Huber, M. L., and McLinden, M. O, 2010, NIST Standard Reference Database 23: Reference Fluid Thermodynamic and Transport Properties-REFPROP, Version 9.0, National Institute of Standards and Technology, Standard Reference Data Program, Gaithersburg.

Massachusetts Institute of Technology, 2006, "The Future of Geothermal Energy-Impact of Enhanced Geothermal Systems (EGS) on the United States in the 21 Century", MIT-led interdisciplinary panel, Tester, J. W., Chairman.

Petty, S, and Porro, G, 2007, "Updated U.S. Geothermal Supply Characterization," National Renewable Energy Laboratory, NREL, March 2007

Sanyal, S., and Butler, S., 2010, "Geothermal Power Capacity from Petroleum Wells—Some Case Histories Of Assessment", Proceedings World Geothermal Congress 2010, Bali, Indonesia, April 2010.

Ramey, H. J., 1962, "Wellbore Heat Transmission," Journal of Petroleum Technology, April 1962, pp. 427-435.

US DOE, Geothermal Maps,

Willhite, G. (1967) "Over-all Heat Transfer Coefficients in Steam and Hot Water Injection Wells" Paper SPE 1449-PA, J Petroleum Tech, 1967; 19(5):607-15.

From the foregoing detailed description of specific embodiments, it should be apparent that patentable systems, methods, and computer-readable media have been described. Although specific embodiments of the disclosure have been described herein in some detail, this has been done solely for the purposes of describing various features and aspects of the systems, methods and media, and is not intended to be limiting with respect to the scope of the systems, methods and media. It is contemplated that various substitutions, alterations, and/or modifications, including but not limited to those implementation variations which may have been suggested herein, may be made to the described embodiments without departing from the scope of the appended claims.

What is claimed is:

1. A system comprising:
    a well comprising a production casing and a production tubing positioned therein, forming an annulus there between;
    an isolation packer positioned in the annulus at a position sufficient to separate the annulus into a first portion and a second portion;
    the well further comprising a tie-back conduit in the first portion of the annulus and concentric with the production casing and the production tubing, the tie-back conduit having a lower end spaced from the isolation sacker allowing a working fluid to circulate vertically through the annulus and allow heat transfer to the working fluid flowing through the first portion of the annulus from a production fluid traversing through the production tubing, thus separating the circulating working fluid from fluids in the second portion of the annulus; and a working fluid loop fluidly connected to the first portion of the annulus.

2. The system of claim 1 wherein the tie-back conduit is positioned to allow heat transfer to the working fluid circulating through the first portion of the annulus from the production fluid traversing through the production tubing as the production fluid flows out of the well.

3. The system of claim 2 wherein the tie-back conduit and production tubing are configured into a substantially parallel-flow heat exchanger.

4. The system of claim 1 further comprising:
the tie-back conduit separating the first portion of the annulus into a working fluid delivery side and a working fluid return side.

5. The system of claim 4 wherein the working fluid loop comprises:
a working fluid return conduit fluidly connecting the working fluid return side to an expansion turbine;
a working fluid delivery conduit fluidly connecting the working fluid delivery side to cooling facility; and
an expanded working fluid conduit fluidly connecting the expansion turbine and the cooling facility.

6. The system of claim 4 further comprising a pump allowing variation of rate of flow of the working fluid in the delivery conduit.

7. The system of claim 1 wherein the well has a depth of at least 10,000 feet, and the isolation packer and tie-back conduit are positioned and configured so that the tie-back conduit has a length ranging from 5000 feet to just under 10,000 feet.

8. An annular circulation co-production system comprising:
a well comprising a production casing and a production tubing positioned therein, forming an annulus there between;
an isolation packer positioned in the annulus at a position sufficient to separate the annulus into a first portion and a second portion;
the well further comprising a tie-back conduit positioned in the first portion of the annulus and concentric with the production casing and the production tubing, the tie-back conduit having a lower end spaced from the isolation packer allowing a working fluid to circulate vertically through the annulus and allow heat transfer to the working fluid flowing through the first portion of the annulus from a production fluid traversing through the production tubing, thus separating the circulating working fluid from fluids in the second portion of the annulus, the tie-back conduit separating the first portion of the annulus into a working fluid delivery side and a working fluid return side; and
a working fluid loop fluidly connected to the first portion of the annulus, the working fluid loop comprising:
a working fluid return conduit fluidly connecting the working fluid return side to a power generation unit;
a working fluid delivery conduit fluidly connecting the working fluid delivery side to cooling facility; and
an expanded working fluid conduit fluidly connecting the power generation unit and the cooling facility.

9. The annular circulation co-production system of claim 8 wherein the tie-back conduit is positioned to allow heat transfer to the working fluid circulating through the first portion of the annulus from the production fluid traversing through the production tubing as the production fluid flows out of the well.

10. The system of claim 9 wherein the tie-back conduit and production tubing are configured into a substantially parallel-flow heat exchanger.

11. A method comprising:
positioning a production casing and a production tubing into a well, forming an annulus there between;
positioning an isolation packer in the annulus at a position sufficient to separate the annulus into a first portion and a second portion;
positioning a tie-back conduit in the first portion of the annulus concentric with the production casing and the production tubing the tie-back conduit having a lower end spaced from the isolation packer allowing a working fluid to circulate vertically through the annulus to allow heat transfer to a working fluid flowing through the first portion of the annulus from a production fluid traversing through the production tubing, thus separating the circulating working fluid from fluids in the second portion of the annulus;
flowing a working fluid into the first portion of the annulus;
flowing a production fluid through the production tubing; and
transferring heat from the production fluid to the working fluid in the first portion of the annulus.

12. The method of claim 11 comprising flowing the working fluid and production fluid in a substantially parallel flow arrangement.

13. The method of claim 11 comprising flowing a working fluid return stream from the first portion of the annulus to a power generation unit, and extracting power from the working fluid return stream using the power generation unit, forming a depleted working fluid.

14. The method of claim 13 comprising flowing the depleted working fluid to a cooling facility, forming a working fluid delivery stream.

15. The method of claim 14 wherein the cooling facility is a cooling tower.

16. The method of claim 14 comprising pumping the working fluid delivery stream to the first portion of the annulus to generate enough hydraulic energy to force the working fluid to the power generation unit.

17. The method of claim 13 comprising flowing the production fluid out of the well and to a facility for processing.

18. The method of claim 13 wherein the power generation unit comprises an expansion turbine.

19. A method of producing a fluid from a source, the method comprising the steps of:
positioning a production casing and a production tubing into a well, forming an annulus there between;
positioning an isolation packer in the annulus at a position sufficient to separate the annulus into a first portion and a second portion;
positioning a tie-back conduit in the first portion of the annulus concentric with the production casing and the production tubing, the tie-back conduit having a lower end spaced from the isolation packer allowing a working fluid to circulate vertically through the annulus to allow heat transfer to a working fluid flowing through the first portion of the annulus from a production fluid traversing through the production tubing, thus separating the circulating working fluid from fluids in the second portion of the annulus;
flowing a working fluid into the first portion of the annulus;
producing a production fluid through the production tubing; and
transferring heat from the production fluid as it is produced from the source to the working fluid as the working fluid flows into and out of the first annulus portion.

* * * * *